United States Patent
Harada et al.

(10) Patent No.: US 6,822,275 B2
(45) Date of Patent: Nov. 23, 2004

(54) TRANSVERSE JUNCTION FIELD EFFECT TRANSISTOR

(75) Inventors: Shin Harada, Osaka (JP); Kenichi Hirotsu, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/168,263

(22) PCT Filed: Dec. 6, 2000

(86) PCT No.: PCT/JP00/08645

§ 371 (c)(1),
(2), (4) Date: Jun. 19, 2002

(87) PCT Pub. No.: WO01/47029

PCT Pub. Date: Jun. 28, 2001

(65) Prior Publication Data

US 2002/0190258 A1 Dec. 19, 2002

(30) Foreign Application Priority Data

| Dec. 21, 1999 | (JP) | 11-362384 |
|---|---|---|
| Dec. 21, 1999 | (JP) | 11-362385 |
| Dec. 21, 1999 | (JP) | 11-362386 |
| Apr. 28, 2000 | (JP) | 2000-129880 |
| Jun. 2, 2000 | (JP) | 2000-165701 |
| Jun. 28, 2000 | (JP) | 2000-194464 |
| Sep. 21, 2000 | (JP) | 2000-286520 |

(51) Int. Cl.[7] .................. H01L 29/80; H01L 31/0312

(52) U.S. Cl. .................. 257/256; 257/77; 257/134; 257/328; 257/329

(58) Field of Search .................. 257/77, 134, 256, 257/272, 274, 287, 328, 329, E21.407, E21.148

(56) References Cited

U.S. PATENT DOCUMENTS

| 4,843,441 | A | * | 6/1989 | Willard | 257/270 |
|---|---|---|---|---|---|
| 5,264,713 | A | | 11/1993 | Palmour | |
| 5,925,895 | A | * | 7/1999 | Sriram et al. | 257/77 |
| 6,165,874 | A | * | 12/2000 | Powell et al. | 438/478 |

FOREIGN PATENT DOCUMENTS

| JP | 64053476 | 3/1989 |
|---|---|---|
| JP | 01103878 | 4/1989 |

OTHER PUBLICATIONS

Landolt–Bornstein—Group III Condensed Matter (Publ: Springer Verlag Heidelberg) ISSN: 1616–9549, vol. 41 / Subvolume A1A / 2001 (2pages plus two Figures).*

M. Shur and T. Fjeldy in "Modern Semiconductor Device Physics" (Ed. S.M. Sze, John Wiley & Sons, New York 1998), "Compound Semiconducter Field–Effect Transistors", pp. 81–82.*

J.M. McGarrity et al.; "Silicon Carbide JFET Radiation Response", IEEE Transactions on Nuclear Science, vol. 39, No. 6, Dec.; 1992; pp. 1974–1981.

(List continued on next page.)

Primary Examiner—Minhloan Tran
Assistant Examiner—Johannes Mondt
(74) Attorney, Agent, or Firm—W. F. Fasse; W. G. Fasse

(57) ABSTRACT

A transverse JFET of SiC, employing an n-type SiC substrate and comprising a channel region having carriers of high mobility, bringing a high yield is obtained. This transverse JFET comprises an n-type SiC substrate (1n), a p-type SiC film (2) formed on the right face of the n-type SiC substrate, an n-type SiC film (3), including a channel region (11), formed on the p-type SiC film, source and drain regions (22, 23) formed on the n-type SiC film separately on both sides of the channel region respectively, and a gate electrode (14) provided in contact with the n-type SiC substrate (1n).

12 Claims, 19 Drawing Sheets

OTHER PUBLICATIONS

P.A. Ivanov et al.; "4H–SiC field–effect transistor hetero–epitaxially grown on 6H–SiC substrate by sublimation"; Inst. Phys. Conf. Ser. No. 142; Chapter 4; Paper presented at Silicon Carbide and Related Materials 1995 Conf., Kyoto, Japan; 1996 IOP Publishing, Ltd., pp. 757–760.

Dev Alok et al.; "High voltage (450 V) 6H–SiC substrate gate JFET (SG–JFET)", Silicon Carbide and Related Materials 1995, E403, 142; Inst. Phys. Conf. Ser. No. 142; Chapter 4, Paper presented at Silicon Carbide and Related Materials 1995 Conf., Kyoto, Japan; 1996 IOP Publishing, Ltd., pp. 749–752.

"The Transactions of the Institute of Electronics, Information and Communication Engineers C–II", The Electronics Society, vol. J81–C–II No. 1, pp. 105–111, Jan. 25, 1998; and translation.

C. T. Gardner et al.; "Dynamic charge storage in 6H silicon carbide", Applied Physics Letters, vol. 61, 7. Sep., 1992, No. 10, pp. 1185, 1186.

* cited by examiner

TRANSVERSE JUNCTION FIELD EFFECT TRANSISTOR

TECHNICAL FIELD

The present invention relates to a transverse junction field effect transistor (JFET: Junction Field Effect Transistor), and more specifically, it relates to a transverse junction field effect transistor employed as a power transistor for electric power.

BACKGROUND TECHNIQUE

A junction field effect transistor (JFET) applies a reverse bias voltage from a gate electrode to a p-n junction provided on a side portion of a channel region passing carriers therethrough, thereby spreading a depletion layer from the p-n junction to the channel region and controlling the conductance of the channel region for performing operation such as switching. In a "transverse" JFET, carriers move in parallel with an element face in the channel region. While the carriers for the channel may be either electrons (n-type) or holes (p-type), mobility of electrons is higher as compared with holes in SiC to which the present invention is directed, and hence the channel region is generally formed by an n-type impurity region. For the purpose of convenience, therefore, it is assumed that the carriers for the channel are electrons and hence the channel region is an n-type impurity region in the following description, while the channel region may alternatively be formed by a p-type impurity region, as a matter of course.

SiC, having large mobility of carriers similarly to Si as described above, a high saturation drift velocity similarly to GaAs and a high withstand voltage, is subjected to study for application to a high-speed switching element or a high-power element. Crystal structures of SiC include a hexagonal closest packing structure and a cubic closest packing structure, while the hexagonal closest packing structure includes a number of structures having different cycle periods of layers and at least 100 polytypes are known. Representative polytypes are 3C, 4H, 6H and the like. C means cubic and H means hexagonal, while the prefixed numerals express cycle periods. Only 3C is cubic and referred to as β—SiC, and the remaining polytypes are referred to as α—SiC as a whole. In the following description, only 6H or 4H of α—SiC is solely employed.

FIG. 34 is a sectional view showing an exemplary JFET employing SiC (U.S. Pat. No. 5,264,713 granted to John W. Palmour et al.). Referring to FIG. 34, the conductivity type of an SiC substrate 101 is preferably the p-type, to define a p-type SiC substrate. The conductivity type of an SiC film 102 formed on a partial region of the SiC substrate 101 is also preferably the p-type, to define a p-type SiC film 102. Further, an n-type SiC film 103 is formed on this p-type SiC film 102 to include a thinned portion 111 corresponding to a channel region. An n⁺-type impurity layer 117 coming into ohmic contact with a source electrode 112 and an n⁺-type impurity layer 118 coming into ohmic contact with a drain electrode 113 are formed on the n-type SiC film 103. A gate electrode 114 is formed on the back side of the aforementioned p-type SiC substrate 101 as a back gate 114. Face portions excluding the aforementioned source, drain and gate electrodes are covered with protective films 126.

In the aforementioned prior art (FIG. 34), the conductivity type of the SiC substrate is preferably set to the p-type for the following reason: As hereinabove described, carriers for the channel region are formed by electrons (n-type), since high mobility is attained. Therefore, the n-type SiC film defines a layer including the channel region. Thus, the p-type SiC film defines a layer limiting the carriers in this n-type SiC film in the periphery. If an n-type SiC substrate is employed as the SiC substrate for forming this p-type SiC film, a reverse bias voltage is applied to the junction between the n-type SiC substrate and the p-type SiC film to result in a depletion layer when a plus potential is applied to the gate electrode. Therefore, it is necessary to evaluate and determine influence by this depletion layer. When the p-type SiC substrate is employed to the contrary, this influence by a depletion layer may not be evaluated and no reverse bias voltage may be taken into consideration in the junction of the multilayer part reaching the channel region in on-off action. When the SiC substrate of the aforementioned conductivity type is employed, therefore, a high-speed switching element for high power or the like can be obtained with carriers having high mobility by growing a depletion layer only in the channel region at need.

However, the p-type SiC substrate has higher defect density of micropipes or the like as compared with the n-type SiC substrate. Therefore, the defect density is increased also in a crystal growth layer essential in fabrication of the semiconductor element such as the JFET. Reflecting such high defect density, the JFET formed on the p-type SiC substrate exhibits a low yield for defining a JFET of complete quality, while a completed JFET exhibits a large leakage current.

In the aforementioned transverse JFET shown in FIG. 34, a forward bias voltage is applied to the junction between the source region 103 formed by an n-type impurity region and the p-type impurity layer 102 in an ON-state. In an OFF-state, a reverse bias voltage is applied to the aforementioned junction, and a depletion layer grows in the channel region to block the channel region. In the ON-state, the forward bias voltage is desirably applied to the junction between the source region 103 formed by an n-type impurity region and the p-type impurity layer 102, and a current escapes from the channel region and flows into the gate electrode 114. The current leaking from the channel region and flowing into the gate electrode 114 increases along with forward bias voltage rise and temperature rise. The current leaking from the channel region and flowing into the gate electrode exerts influence on the amplification factor, and the amplification factor is problematically lowered when this current increases.

In the transverse JFET shown in FIG. 34, the aforementioned p-n junction is formed on the overall face of the p-type epitaxial SiC film. As compared with the area of the part of the channel region in contact with the bottom of a trench 124, therefore, the area of the aforementioned p-n junction between the n-type impurity region 103 and the p-type impurity region is problematically excessive. In other words, the ratio of a part not contributing to on-off action but defining the path for the aforementioned current leaking from the channel region is problematically large as compared with a small ratio of the area of the channel region performing on-off action in the p-n junction.

FIG. 35 is a schematic sectional view of another conventional transverse JFET employing SiC (P. A. Ivanov et al.: 4H—SiC Field-Effect Transistor Hetero-Epitaxially Grown on 6H—SiC Substrate by Sublimation, p. 757, Silicon Carbide and Related Materials, 1995 Conf., Kyoto, Japan). Referring to FIG. 35, a 4H—SiC film 109 containing Sn is hetero-epitaxially grown on a 6H—SiC substrate 101, for defining a buffer layer 109. An SiC film 102 containing Al serving as a p⁺-type impurity is formed on the buffer layer 109, and an n-type SiC film 103 containing nitrogen, having a channel region 111 arranged on the central portion along with a source region 117 and a drain region 118 located on both sides thereof is formed thereon. A source electrode 112 and a drain electrode 113 are provided on upper portions of the left and right sides of the channel region, and gate electrodes 114 are formed on portions downward beyond the source and drain electrodes through trenches 115. Ni films defining underlayer films 120 and Al films defining upper films 121 are formed as the electrodes 114. When this transverse JFET is employed, a JFET having high drift mobility of electrons and extremely high mobility of electrons can be formed.

However, the JFET shown in FIG. 35 has the following problems:

(a) The JFET is insufficient in points of high withstand voltage and low ON-state resistance.

The withstand voltage of a JFET depends on the withstand voltage of a p-n junction formed by an n-type impurity region defining a channel and a p-type impurity region in contact with this region. In order to improve the withstand voltage of the JFET, therefore, the withstand voltage of the p-n junction may be improved. While the concentration of an n-type impurity defining the impurity in the channel may be reduced in order to improve the withstand voltage of the p-n junction, the quantity of a current in the channel is reduced and ON-state resistance (resistance in a state where carriers flow in the channel region) is increased as a result. Consequently, power is consumed and the element temperature is increased. A transverse JFET exhibits a negative temperature coefficient in a large drain current range and hence negative feedback is applied with respect to temperature rise, while no negative feedback is applied in a small drain current range. Power consumption in the element is unpreferable regardless of the value of the drain current. Another reason for the impossibility of reducing the aforementioned ON-state resistance of the JFET resides in contact resistance in the electrodes. When each electrode is made of Ni in the structure shown in FIG. 35, impurity concentration is so low that Schottky contact tends to remain and ohmic contact cannot be attained.

(b) The JFET is insufficient in switching speed.

The switching speed depends on the charge/discharge time for a depletion layer in the p-n junction. Assuming that C represents the capacitance of the depletion layer and Rg represents gate resistance, the charge/discharge time is substantially proportionate to the product CRg thereof. Therefore, the switching time can be quickened if the gate resistance Rg can be lowered, while the trenches are formed in the second conductivity region and the gate resistance cannot be sufficiently lowered in the conventional JFET shown in FIG. 35. When attaching importance to intuitive grasp while slightly sacrificing correctness, the gate resistance Rg can be regarded as the resistance of paths reaching the p-n junction interface on the central portion of the channel 111 from the gate electrodes 114.

(c) Fabrication steps are complicated and require precise and strict management.

The aforementioned JFET shown in FIG. 35 is fabricated by the following method: The buffer layer 109 is formed on the SiC substrate 101, followed by formation of the p$^+$-type SiC film 102. Then, the n-type SiC film is formed for patterning portions formed with the channel, source and drain regions by RIE (reactive ion etching), as shown in FIG. 36. Then, the Ni films are formed as the underlayers 120 of the electrodes, as shown in FIG. 37. The Al films defining the upper layers 121 of the electrodes are formed on the Ni films, as shown in FIG. 38. At this time, the Al films may not be registrable immediately on the Ni films but may be misregistered. When adhering to side walls or the like, Al acts as floating electrodes to unstabilize the element operation. Then, the portion between the source electrode 112 and the drain electrode 113 is etched by RIE through the electrodes 112 and 113 serving as masks for forming the channel region 111, as shown in FIG. 39. At this time, the face of the p$^+$ film 102 is also etched for defining the trenches 115 along with the channel region. In this etching, Al or the like adhering due to the aforementioned misregistration is also removed. The electrodes are formed by the two-layer films of the Ni films and the Al films, in order to form ohmic contact. The resistance Rg of the paths reaching the p-n junction interface on the central portion of the channel region from the gate electrodes is increased due to the aforementioned trenches, and the rise (fall) time is increased when the JFET is applied to a switching element. Further, additional man-hours are required for forming the trenches, leading to increase of the cost.

(d) Transistor characteristics remarkably fluctuate in response to dispersion of the impurity concentration, the thickness etc. of the channel region. When a high-concentration impurity element is injected for reducing the electric resistance of the channel region in order to avoid such dispersion between elements, withstand voltage is deteriorated. Therefore, awaited is a JFET, employing no high-concentration impurity, hardly influenced by dispersion of the impurity concentration, the thickness etc. of the channel region.

(e) The aforementioned JFET is of a normally on type (enters an ON-state when no voltage is applied to the gate) in general, and the structure of the gate circuit is complicated when employed for controlling a rotary machine or the like. In other words, the JFET enters an ON-state when no voltage is applied to the gate, and hence the rotary machine hazardously remains rotating if the gate circuit breaks down. In preparation for breakdown, therefore, the gate circuit must be provided with a mechanism for turning off the same upon breakdown. Further, a voltage must be continuously applied in an OFF-state, and hence power consumption takes place in the OFF-period.

(f) Operation is unstabilized due to surface charges with a large surface leakage current.

A malfunction results from such surface charges or the surface leakage current, to lower the yield.

The present invention has been proposed in order to solve the aforementioned problems, and a first object thereof is to obtain a transverse JFET of SiC bringing a high yield, employing an n-type SiC substrate and comprising a channel region having carriers exhibiting high mobility.

A second object of the present invention is to provide a transverse JFET, which is easy to fabricate, has low loss and is excellent in withstand voltage and high-speed switching characteristics.

A third object of the present invention is to provide a transverse JFET suppressing a current leaking from a channel region in an ON-state to cause no reduction of the amplification factor.

DISCLOSURE OF THE INVENTION

A transverse JFET according to a first aspect of the present invention comprises an n-type SiC substrate, a p-type SiC film formed on the right face of the n-type SiC substrate, an n-type SiC film, including a channel region, formed on the p-type SiC film, source and drain regions formed on the n-type SiC film separately on both sides of the channel region, and a gate electrode provided in contact with the n-type SiC substrate.

According to the aforementioned structure, a JFET driving carriers exhibiting high mobility can be prepared with a high yield while employing an n-type SiC substrate having low defect density. In this case, presence/absence of a problem depends on whether the JFET is in an ON-state or in an OFF-state. The significance of the transverse JFET according to the first aspect of the present invention resides in that the transverse JFET is prepared on the n-type SiC substrate, and hence it is premised that the n-type and the p-type are not replaced with each other only in the transverse JFET according to the first aspect of the present invention. To the contrary, the remaining aspects of the present invention hold also when the n-type and the p-type are replaced with each other, and hence replacement of the n-type and the p-type is assumed.

In an OFF-state of a normally on JFET, a negative gate voltage is applied and hence no problem arises. In other words, a forward bias voltage is applied to the junction between the n-type SiC substrate and the p-type SiC film in the OFF-state, and hence no depletion layer is formed on this junction. In the aforementioned OFF-state, a reverse bias voltage is applied to only the junction between the p-type SiC film and the n-type SiC film, and a depletion layer spreads in the channel region having a low impurity concentration to block a carrier path.

In an OFF-state of a normally off JFET, built-in potentials are generated in the junction between the n-type SiC substrate and the p-type SiC film and the junction between the p-type SiC film and the n-type SiC film respectively to form depletion layers, while the same individually spread respectively to cause no problem.

In an ON-state of the normally on JFET, the gate voltage may be set to 0 V, while a depletion layer spreads due to a built-in potential. In order to feed a larger quantity of current, a plus potential must be supplied to the gate in order to eliminate the depletion layer resulting from the built-in potential. Therefore, study is required as to the depletion layer formed following application of the plus potential to the gate. When the potential of the gate electrode is plus, a reverse bias voltage is applied to the junction between the n-type SiC substrate and the p-type SiC film. When both of the impurity concentration of the n-type SiC substrate and the impurity concentration of the p-type SiC film are increased, however, the width of the depletion layer is reduced. Therefore, a current flows through the depletion layer due to tunneling. Withstand voltage of the junction may disappear due to the increased impurity concentrations, to result in flow of a current. Therefore, the depletion layer in the aforementioned junction hardly influences the operation. In order to obtain the aforementioned junction, the n-type impurity concentration of the n-type SiC substrate may be set to about $1 \times 10^{19}$ cm$^{-3}$, and the p-type impurity concentration of the p-type SiC film may be set to about $1 \times 10^{19}$ cm$^{-3}$. Consequently, a JFET of SiC capable of high-speed operation such as high-speed switching can be prepared by improving the yield from preparation of the SiC substrate to completion of the product.

In an ON-state of the normally off JFET, a phenomenon similar to that in the ON-state of the aforementioned normally on JFET takes place, and hence no particular problem arises as described above.

A voltage is applied in the following manner in response to whether the JFET is normally on or normally off, for performing on-off action: In the normally on JFET, the gate voltage is varied in the range of minus (off) to plus (on). In the normally off JFET, the gate voltage is varied in the range of zero (off) to plus (on). The normally off JFET is implemented by satisfying prescribed requirements as to the impurity concentrations and the structures, as described above.

In the JFET according to the aforementioned first aspect of the present invention, a region of the p-type SiC film can include a region of the n-type SiC film as viewed in plane, for example.

According to this structure, an end face of the n-type SiC film is located inside the end face of the p-type SiC film forming the underlayer as viewed in plane. In other words, a step is provided between the p-type SiC film and the n-type SiC film located thereon. The end faces of these SiC films are generally formed by RIE (reactive ion etching). In the structure that the end face of the n-type SiC film and the end face of the p-type SiC film align with each other as in the prior art, the end face of the n-type SiC film is continuously exposed to ions when both the n-type SiC film and the p-type SiC film forming the underlayer therefor are etched. In the aforementioned structure, on the other hand, the end face of the n-type SiC film is formed by second etching after etching the end face of the p-type SiC film. Therefore, this end face is exposed to ions only in a short period for the second etching. Consequently, the end face of the n-type SiC film including the channel, source and drain regions is exposed to ions for a short time to hardly result in deterioration of a surface crystal layer remarkably influencing transistor characteristics.

In the JFET according to the aforementioned first aspect of the present invention, the gate electrode is arranged on the right face of the n-type SiC substrate in the vicinity of an end of the p-type SiC film, for example.

According to this structure, the JFET can be prepared by a simple preparation method, while an OFF-state can be implemented by reliably applying a reverse bias voltage to the junction between the p-type semiconductor film and the channel region (the n-type semiconductor film) and forming a depletion layer.

In the JFET according to the aforementioned first aspect of the present invention, the gate electrode is formed on the back side of the n-type SiC substrate, for example, and arranged in a back gate structure.

A signal for applying a gate voltage is linearly transmitted to the channel region from the front face of the channel region in a wide range due to employment of the aforementioned back gate structure, whereby the switching speed can be improved. Further, the gate electrode is not arranged on a position spreading from the channel region but stereoscopically arranged in superposition with the channel region, whereby the degree of integration of the JFET can be improved. Also in the back gate structure, a depletion layer is formed on the junction between the n-type SiC substrate and the p-type SiC film due to application of a plus voltage to the gate. However, this depletion layer can be prevented from influencing the operation of the JFET by improving the impurity concentrations on both sides, as described above.

In the JFET according to the first aspect of the present invention, the thickness of the channel region is rendered smaller than the width of a depletion layer in the n-type SiC film resulting from a built-in potential on the junction between the p-type SiC film and the n-type SiC film formed on the p-type SiC film, for example.

According to this structure, a depletion layer is formed on the junction between the p-type SiC film and the n-type SiC film when the gate potential is zero, and the forward end of the width of the depletion layer exceeds the thickness of the channel region. Therefore, the channel region is deenergized and an OFF-state is implemented when the gate voltage is zero.

The JFET according to the aforementioned first aspect of the present invention can further comprise a low-concentration n-type SiC film, held in contact between the p-type SiC film and the n-type SiC film, containing an n-type impurity of a lower concentration than the n-type impurity concentration of the channel region, for example.

According to this structure, a transverse JFET having high withstand voltage can be obtained with an n-type SiC substrate having low defect density, without influencing a current in the channel region. Thus, a transverse JFET exhibiting small power consumption and low temperature rise also when fed with a high current can be fabricated at a low cost.

In the JFET according to the aforementioned first aspect of the present invention, the channel region can contain an n-type impurity of a higher concentration than the impurity concentration of portions of the n-type SiC film located on both sides thereof, for example.

According to this structure, a depletion layer can be formed to close sections of the channel on both sides of the channel region with the n-type SiC substrate having low defect density for attaining an OFF-state so that the portion of the depletion layer withstands the voltage. Therefore, ON-state resistance can be reduced without reducing the withstand voltage of the transverse JFET, which can be employed as a switching element having high withstand voltage with low loss.

The JFET according to the aforementioned first aspect of the present invention can have a conductor film arranged in contact with the face of the channel region, for example.

According to this structure, the channel region and the conductor film are arranged in parallel with respect to a current flowing through the channel. Therefore, when the electric resistance of the conductor film is lower by 1 order as compared with the channel region, for example, a current flowing through the conductor film in an ON-state is increased by about 10 times as compared with that flowing through the channel region. Also when the impurity concentration or the thickness of the channel region is dispersed, therefore, influence exerted on the transistor characteristics is so small that influence by dispersion of such a factor substantially causes no problem. In an OFF-state, on the other hand, a depletion layer extends toward the n-type SiC film in the junction between the n-type SiC film including the channel region and the p-type SiC film defining the underlayer therefor due to a negative potential (reverse bias voltage) applied to the gate electrode. This depletion layer more widely expands toward a side having lower concentration in proportion to the aforementioned reverse bias voltage and in inverse proportion to the impurity concentrations of the n-type SiC film including the channel region and the p-type SiC film serving as the underlayer therefor. When this depletion layer blocks the channel region, the path for carriers passing through the channel region is blocked. Consequently, the OFF-state can be readily implemented.

When the JFET according to the aforementioned first aspect of the present invention comprises the conductor film, the length of the conductor film along the channel length direction can be rendered smaller than a channel length, for example.

At least an end of the conductor film is insulated from a side wall, and hence the JFET can be turned off by deenergizing the channel region on the side insulated from the depletion layer.

When the JFET according to the aforementioned first aspect of the present invention comprises the conductor film, the thickness of the channel region can be rendered smaller than the width of a depletion layer in the n-type SiC film resulting from a built-in potential on the junction between the p-type SiC film and the n-type SiC film formed on the p-type SiC film, for example.

When the gate potential is zero, the depletion layer formed on the junction between the p-type SiC film and the n-type SiC film due to the built-in potential blocks the channel region. Therefore, a normally off transverse JFET can be obtained and can be employed for controlling a rotary machine or the like without taking countermeasures against breakdown of the gate circuit or the like. Further, power consumption can be reduced in the ON-state, and influence by dispersion of the impurity concentration of the channel region or the like can be avoided.

When the JFET according to the aforementioned first aspect of the present invention comprises the conductor film, the conductor film can be either a metal film or a semiconductor film containing a high-concentration impurity, for example.

According to the aforementioned structure, a parallel bypass of low resistance can be simply provided on the channel region with a metal film of low resistance. The metal film may be made of any material so far as the same serves as an electrode material, while aluminum (Al) or an aluminum alloy is desirable in consideration of easiness of etching and high conductivity.

In the JFET according to the aforementioned first aspect of the present invention, the SiC substrate is a 6H—SiC substrate, and both of the p-type SiC film and the n-type SiC film are made of 6H—SiC.

According to this structure, thin films having excellent crystallinity are stacked so that the yield is not reduced due to a malfunction or the like resulting from poor crystallinity.

In the JFET according to the aforementioned first aspect of the present invention, both of the p-type SiC film and the n-type SiC film can be made of 4H—SiC, and the p-type SiC film consisting of 4H—SiC can be formed on a 6H—SiC substrate through a buffer layer of 4H—SiC, for example.

A 4H—SiC film having excellent crystallinity can be obtained by the buffer layer while 4H—SiC exhibits mobility of electrons superior to that in 6H—SiC or the like, whereby the JFET can be rendered suitable to a high-speed switching element or the like.

In the JFET according to the aforementioned first aspect of the present invention, the SiC substrate can be a 4H—SiC substrate, and both of the p-type SiC film and the n-type SiC film can be made of 4H—SiC, for example.

According to the aforementioned structure, thin films having excellent crystallinity are stacked, and the yield or the like is not reduced due to a malfunction or the like resulting from poor crystallinity. Further, 4H—SiC exhibits mobility of electrons superior to that in 6H—SiC or the like as described above, whereby the JFET can be rendered suitable to a high-speed switching element or the like.

In the JFET according to the aforementioned first aspect of the present invention, both of the p-type SiC film and the n-type SiC film can be made of 6H—SiC, and the p-type SiC film consisting of 6H—SiC can be formed on a 4H—SiC substrate through a buffer layer of 6H—SiC, for example.

A 6H—SiC film having excellent crystallinity can be obtained by the buffer layer, and SiC of a proper crystal type can be employed in response to application.

The significance of the transverse JFET according to the first aspect of the present invention resides in that the transverse JFET is prepared on the n-type SiC substrate as hereinabove described, and hence it is premised that the n-type and the p-type are not replaced with each other only in the transverse JFET according to the first aspect of the present invention. To the contrary, transverse JFETs according to those following a second aspect of the present invention hold also when the n-type and the p-type are replaced with each other, and hence the conductivity type of an impurity is referred to as a first conductivity type or a second conductivity type. The first conductivity type may be either the p-type or the n-type, and the second conductivity type may be either the n-type or the p-type.

The transverse JFET according to the second aspect of the present invention comprises an SiC substrate, a second conductivity type SiC film formed on the SiC substrate, a first conductivity type SiC film formed on the second conductivity type SiC film, a channel region formed by reducing the thickness of the first conductivity type SiC film, a source region and a drain region, films consisting of first conductivity type SiC formed on the first conductivity type SiC film, separately formed on both sides of the channel region respectively, and a gate electrode, and the gate electrode is formed on a flat region of second conductivity type SiC.

According to this structure, the gate is formed on the flat region of the second conductivity type SiC, whereby gate resistance can be reduced and a speed of response in switching can be increased as a result. Further, slight misregistration in formation of the gate electrode causes no problem in a fabrication step, whereby the yield can be prevented from reduction. Thus, the JFET can be applied to a high-speed switching element.

In the transverse JFET according to the aforementioned second aspect of the present invention, the second conductivity type SiC film has an untrenched face, and the gate electrode consists of two gate electrodes formed on the flat face of the second conductivity type SiC film forming the flat region of second conductivity type SiC, for example.

According to this structure, no trenches or the like are provided between the source and drain regions and the gate, whereby gate resistance can be reduced and the speed of response in switching can be improved as a result. Further, slight misregistration in formation of the gate electrode causes no problem in a fabrication step, whereby the yield can be prevented from reduction.

In the transverse JFET according to the aforementioned second aspect of the present invention, the SiC substrate is a second conductivity type SiC substrate containing a second conductivity type impurity, and the gate electrode is formed in a back gate structure provided on the back side of the second conductivity type SiC substrate forming the flat region of second conductivity type SiC, for example.

According to this structure, the gate electrode is provided on the overall back side of the second conductivity type SiC substrate, whereby gate resistance is reduced. Consequently, the speed of response in switching is improved, and the JFET can be employed as a high-speed switching element. Further, the gate electrode can be readily formed.

The transverse JFET according to the aforementioned second aspect of the present invention preferably further comprises a low-concentration first conductivity type SiC film, held in contact between the second conductivity type SiC film and the first conductivity type SiC film, containing a first conductivity type impurity of a lower concentration than the first conductivity type impurity concentration of the channel region.

According to this structure, withstand voltage can be improved without exerting influence on a current in the channel region. Therefore, high withstand voltage can be attained with small power consumption without increasing the temperature also when feeding a high current. Consequently, the JFET can be applied to a high-voltage and high-power switching element.

In the transverse JFET according to the aforementioned second aspect of the present invention, the channel region can contain a first conductivity type impurity of a higher concentration than the impurity concentration of portions of the first conductivity type SiC film located on both sides thereof.

According to this structure, a depletion layer is formed to close sections of the channel from both sides of the channel region for attaining an OFF-state so that the portion of the depletion layer withstands the voltage, whereby ON-state resistance can be reduced without reducing the withstand voltage of the transverse JFET. Therefore, this transverse JFET, consuming no power also when fed with a high current, can be employed as a switching element having high withstand voltage with low loss.

In the transverse JFET according to the aforementioned second aspect of the present invention including the low-concentration first conductivity type SiC film, the channel region contains a first conductivity type impurity of a higher concentration than the impurity concentration of portions of the first conductivity type SiC film located on both sides thereof.

According to this structure, ON-state resistance can be reduced without remarkably reducing the withstand voltage of the transverse JFET. Consequently, the JFET can be applied to a high-voltage high-power switching element.

In the transverse JFET according to the aforementioned second aspect of the present invention, the thickness of the channel region is smaller than the width of a depletion layer in the first conductivity type SiC film resulting from a built-in potential on the junction between the second conductivity type SiC film and the first conductivity type SiC film formed on the second conductivity type SiC film, for example.

According to the aforementioned structure, a normally off JFET can be obtained by spreading the depletion layer resulting from a built-in potential on the junction between the channel region (first conductivity type semiconductor layer) and the second conductivity type semiconductor layer located under the same, for example. In this transverse JFET, the impurity concentration of the channel region is not more than $5 \times 10^{16}$ cm$^{-3}$, and the thickness of the channel region is set to not more than 550 nm, for example. When setting the impurity concentration of the channel region to not more than $5 \times 10^{16}$ cm$^{-3}$ while setting the impurity concentration in the second conductivity type SiC film to a general-level concentration higher than the same, the width of the aforementioned depletion layer exceeds 550 nm. Therefore, a state where the depletion layer extending in the channel region blocks this channel region is implemented with a gate voltage of zero. In other words, a normally off JFET can be obtained and the aforementioned JFET can be loaded on a rotary machine or the like without providing a circuit employing a complicated countermeasure against breakdown of the gate circuit.

In order to attain an ON-state, a positive potential overcoming the built-in potential may be applied. A built-in potential generated in a thermal equilibrium state is 2 V to 3 V in general, and hence the aforementioned depletion layer is removed and the channel region is rendered conductive when a positive potential of 2 V to 3 V is supplied to the gate electrode. The applied potential in the aforementioned OFF-state is 0 V, and hence off-time power consumption can be remarkably reduced as compared with an applied potential of about 22 V necessary for turning off a normally on JFET. Consequently, a JFET having low power consumption readily loadable on a rotary machine or the like can be provided while ensuring a high-speed switching function with low loss and high withstand voltage.

In the transverse JFET having the channel region containing the first conductivity type impurity in a higher concentration than the impurity concentration of the portions of the first conductivity type SiC film located on both sides thereof according to the aforementioned second aspect of the present invention, the thickness of the channel region is rendered smaller than the width of a depletion layer in the first conductivity type SiC film resulting from a built-in potential on the junction between the second conductivity type SiC film and the first conductivity type SiC film formed on the second conductivity type SiC film, for example.

This structure implements a state where the depletion layer extending toward the first conductivity type SiC film on the side portion of the channel region blocks the channel region with a gate voltage of zero. The depletion layer may block one side of the channel region, or may block both sides of the channel region. Therefore, a normally off JFET is obtained and can be employed without forming a complicated mechanism for a countermeasure against breakdown of the gate circuit for controlling a rotary machine or the like.

The transverse JFET according to the aforementioned second aspect of the present invention can have a conductor film arranged in contact with the face of the channel region.

According to the aforementioned structure, the channel region and the conductor film are arranged in parallel with respect to a current flowing through the channel. Therefore, when the electric resistance of the conductor film is lower by 1 order as compared with the channel region, for example, a current flowing through the conductor film in an ON-state is higher by about 10 times as compared with that in the channel region. Also when the impurity concentration or the thickness of the channel region is dispersed, therefore, only slight influence is exerted on the transistor characteristics such that influence by dispersion of such factors substantially causes no problem. In the OFF-state, on the other hand, the depletion layer extends toward the first conductivity type semiconductor layer on the junction between the first conductivity type semiconductor layer including the channel region and the second conductivity type semiconductor layer located under the same due to the negative potential (reverse bias voltage) applied to the gate electrode. This depletion layer more widely expands toward a side having a lower concentration in proportion to the aforementioned reverse bias voltage and in inverse proportion to the impurity concentration of the first conductive layer and the second conductive layer. When this depletion layer blocks the channel region, a path for carriers passing through the channel region is blocked. When the aforementioned conductor film is so arranged that the side portions thereof are not in contact with the portions of the first conductivity type semiconductor layer holding the channel region therebetween, for example, not only the channel region but also the conductor film is deenergized by the aforementioned deenergization. Consequently, the OFF-state can be readily implemented. Also when the aforementioned conductor film is in contact with only one side of the aforementioned first conductivity type semiconductor layer without coming into contact with the other side, the aforementioned OFF-state can be readily implemented and the resistance can be reduced. This reduction of the resistance reduces influence by dispersion of the impurity concentration or dispersion of the thickness of the channel region. When both sides of the aforementioned conductor film are in contact with the aforementioned first conductivity type semiconductor layer respectively, the resistance is further reduced, to be more hardly influenced by dispersion of the aforementioned impurity concentration or dispersion of the thickness of the channel region. The first conductivity type may be either the n-type or the p-type, and the second conductivity type may be either the p-type or the n-type. Further, the semiconductor substrate may be either an n-type Si substrate or a p-type Si substrate, or may be either an n-type SiC substrate or a p-type SiC substrate.

In the transverse JFET according to the aforementioned second aspect of the present invention, the length of the conductor film along the channel length direction is preferably rendered smaller than a channel length.

According to this structure, difficulty in attainment of OFF action can be eliminated when both ends of the conductor film are in contact with side walls. In other words, at least an end of the aforementioned conductor film is insulated from the side wall, and hence the JFET can be turned off by blocking the channel region on the side where the depletion layer is insulated.

In the transverse JFET according to the aforementioned second aspect of the present invention, the thickness of the channel region is rendered smaller than the width of a depletion layer in the first conductivity type SiC film resulting from a built-in potential on the junction between the second conductivity type SiC film and the first conductivity type SiC film formed on the second conductivity type SiC film.

According to the aforementioned structure, the depletion layer generated on the junction between the second conductivity type semiconductor film and the first conductivity type semiconductor film due to the built-in potential blocks the channel region when the gate potential is zero. Therefore, a normally off JFET can be obtained and can be employed for controlling a rotary machine or the like without a countermeasure against breakdown of the gate circuit. Further, power consumption can be reduced in the ON-state, and influence by dispersion of the impurity concentration of the channel region or the like can be avoided.

In the transverse JFET according to the aforementioned second aspect of the present invention, the conductor film is either a metal film or a semiconductor film containing a high-concentration impurity, for example.

According to the aforementioned structure, a parallel bypass of low resistance can be readily provided on the channel region with a metal film of low resistance. The metal film may be made of any material so far as the same serves as an electrode material, while aluminum (Al) or an aluminum alloy is desirable in consideration of easiness of etching and high conductivity.

In the transverse JFET according to the aforementioned second aspect of the present invention, the source region and the drain region can contain a first conductivity type impurity of a higher concentration than the impurity concentration of portions of the first conductivity type SiC film located on both sides of the channel region.

According to this structure, the ON-state resistance can be reduced without reducing the withstand voltage. Further, ohmic contact can be formed without bringing the electrode into a two-layer structure employing Ni and Al or the like. Therefore, no trenches may be formed in a fabrication step as a result. Consequently, gate resistance can be suppressed and a rise (fall) time in switching can be reduced.

In the transverse JFET according to the aforementioned second aspect of the present invention, the impurity concentration of the second conductivity type SiC film can exceed $10^{19}$ cm$^{-3}$.

According to this structure, ohmic contact in the gate electrode holds and the gate resistance is reduced also in a case of a single-layer electrode of Ni or the like. Therefore, a rise time or a fall time in switching can be reduced, and high-speed response is enabled.

In the transverse JFET according to the aforementioned second aspect of the present invention, a source electrode formed on the source region, a drain electrode formed on the drain region and the gate electrode formed on the second conductivity type SiC film or the second conductivity type SiC substrate are preferably made of metals coming into ohmic contact with SiC, containing impurities, in contact with the respective electrodes.

According to this structure, the electrodes can be formed through simple steps. In other words, electrode plates may have a single-layer structure, and may not have a two-layer structure or the like. Therefore, no trenches for increasing gate resistance are formed as a result, and the rise (fall) time in switching can be reduced. Metals forming ohmic contact with the second conductivity type and first conductivity type SiC films containing impurities in high concentrations include Ni and the like.

In the transverse JFET according to the aforementioned second aspect of the present invention, a face portion excluding the source electrode, a drain electrode and the gate electrode is preferably covered with an insulating film.

When the element face is exposed, unstable operation results from a surface leakage current or formation of surface charges. Switching operation can be stably carried out while preventing such trouble due to the covering with the aforementioned insulating film.

In the transverse JFET according to the aforementioned second aspect of the present invention, the SiC substrate is a 6H—SiC substrate, and both of the second conductivity type SiC film and the first conductivity type SiC film are made of 6H—SiC, for example.

According to the aforementioned structure, thin films having excellent crystallinity are stacked and no reduction of the yield or the like is caused due to a malfunction or the like resulting from poor crystallinity.

In the transverse JFET according to the aforementioned second aspect of the present invention, both of the second conductivity type SiC film and the first conductivity type SiC film are made of 4H—SiC, and the second conductivity type SiC film consisting of 4H—SiC is formed on a 6H—SiC substrate through a buffer layer of 4H—SiC, for example.

A 4H—SiC film having excellent crystallinity can be obtained by the buffer layer, and the mobility of electrons in 4H—SiC is superior to that in 6H—SiC or the like, whereby the JFET can be rendered suitable to a high-speed switching element or the like.

In the transverse JFET according to the aforementioned second aspect of the present invention, the SiC substrate is a 4H—SiC substrate, and both of the second conductivity type SiC film and the first conductivity type SiC film are made of 4H—SiC, for example.

According to the aforementioned structure, thin films having excellent crystallinity are stacked and no reduction of the yield or the like is caused due to a malfunction or the like resulting from poor crystallinity. Further, the mobility of electrons in 4H—SiC is superior to that in 6H—SiC or the like as hereinabove described, whereby the JFET can be rendered suitable to a high-speed switching element or the like.

In the transverse JFET according to the aforementioned second aspect of the present invention, both of the second conductivity type SiC film and the first conductivity type SiC film are made of 6H—SiC, and the second conductivity type SiC film consisting of 6H—SiC is formed on a 4H—SiC substrate through a buffer layer of 6H—SiC, for example.

A 6H—SiC film having excellent crystallinity can be obtained by the buffer layer, and SiC of a proper crystal type can be employed in response to application.

A transverse JFET according to a third aspect of the present invention comprises an SiC substrate, having a gate electrode, of a conductivity type of either a first conductivity type or a second conductivity type reverse thereto, a first SiC film formed on the SiC substrate, and a first conductivity type second SiC film, formed on the first SiC film, including a channel region reduced in thickness and source and drain regions holding the channel region from both sides. In this transverse JFET, the first SiC film consists of a high-concentration impurity region, provided on a portion located under the channel region, having a width substantially identical to the width of the channel region and a length smaller than the length of the channel region and containing a second conductivity type impurity in a higher concentration than the value of the first conductivity impurity concentration of the channel region and a high-resistance region, other than the high-concentration impurity region, having high electric resistance.

The aforementioned high-concentration impurity region forms a junction between the same and the channel region and forms a high potential barrier against carriers, while the carriers penetrate into the high-concentration impurity region due to tunneling or the like. The carriers penetrating into the high-concentration impurity region recombine with the high-concentration impurity to annihilate and form a wattless leakage current, disadvantageously reducing the amplification factor. Such a wattless leakage current tends to increase as the forward bias voltage is increased and the temperature is increased. Therefore, the length of the high-concentration impurity region is reduced beyond that of the channel region for reducing the sectional area along the thickness direction, thereby increasing electric resistance of the high-concentration impurity region along the thickness direction. The remaining portion of the first SiC film other than the high-concentration impurity region is rendered to define a high-resistance region despite a large sectional area along the thickness direction. This high-resistance region is so provided that the quantity of currents leaking from the source and carrier regions to the first SiC film can be reduced as compared with a case of rendering the overall portion to define the aforementioned high-concentration impurity region without providing this. In other words, the electric resistance of the first SiC film in contact with the source region and the channel region is increased as a whole, thereby suppressing currents leaking from the source region and the channel region to the first SiC film in the ON-state. Therefore, most current flows from the source region into the drain region through the channel region. On the other hand, the OFF-state is implemented by a depletion layer extending to the channel region and deenergizing the channel region by applying a reverse bias voltage to the junction between the aforementioned high-concentration impurity region and the channel region. The longitudinal direction of the channel region is regarded as the length, the direction perpendicular to the stacked faces is regarded as the thickness direction, and the direction perpendicular to these directions is regarded as the direction of width of the transverse JFET.

The aforementioned gate electrode may be provided either on the back side of the SiC substrate or on portions of the SiC substrate located on both sides of the aforementioned first SiC film. The SiC substrate preferably contains the impurity in high concentration regardless of the first or second conductivity type, in order to enable ohmic contact with the gate electrode.

Growth of the depletion layer to the channel region upon application of the reverse bias voltage is simplified as the ratio between the second conductivity type impurity concentration of the high-concentration impurity region and the first conductivity type impurity concentration of the channel region is increased. Therefore, the high-concentration impurity region containing the impurity of the reverse conductivity type to the channel region in higher concentration than the value of the impurity concentration in the channel region is provided, while the length thereof is reduced below that of the channel region since the sectional area with respect to the thickness direction must be reduced for increasing the electric resistance. The sectional area with respect to the thickness direction is reduced as the length of the high-concentration impurity region is reduced, such that the current flowing into the gate electrode can be suppressed to a degree causing no problem in practice by setting the length to not more than about 1 μm, for example. If the length is excessively reduced, however, the depletion layer hardly blocks the channel region and carriers pass through the depletion layer due to tunneling even if the depletion layer blocks the channel region, and hence the length is set to at least a level capable of implementing the OFF-state due to formation of the depletion layer.

Consequently, the currents leaking from the source and channel regions to the first SiC film can be suppressed for preventing the amplification factor from reduction.

In the transverse JFET according to the aforementioned third aspect of the present invention, the high-resistance region contains a first conductivity type impurity having a concentration value lower than the value of the first conductivity type impurity concentration of the second SiC film, for example.

Any of the following four structures corresponds to the aforementioned structure: (a) A case where the channel region and the high-resistance region are of the n-type and the substrate (gate) is of the p-type, (b) a case where the channel region and the high-resistance region are of the n-type and the substrate (gate) is of the n-type, (c) a case where the channel region and the high-resistance region are of the p-type and the substrate (gate) is of the n-type, and (d) a case where the channel region and the high-resistance region are of the p-type and the substrate (gate) is of the p-type. In the cases (b) and (d) among these, i.e., when the high-resistance region and the substrate are of the same conductivity type, no depletion layer is formed on the junction between the high-resistance region and the substrate but the aforementioned leakage current is suppressed by high resistance resulting from low impurity concentration.

In the cases (a) and (c), i.e., when the high-resistance region and the substrate are of different conductivity types, on the other hand, the following takes place: In the case (a), a plus potential is applied to the gate in the ON-state. In the case (c), a minus potential is applied to the gate in the ON-state. In both cases (a) and (c), therefore, the substrate and the high-resistance layer in the first SiC film are forward-biased to spread no depletion layer. Also in the cases (a) and (c), the aforementioned leakage current can be suppressed due to the high-resistance layer resulting from the low impurity concentration.

In any of the aforementioned cases, most current flows from the source region to the drain region via the channel region in the ON-state. Therefore, reduction of the amplification factor can be prevented by suppressing wattless currents leaking from the source and channel regions to the first SiC film. In the aforementioned transverse JFET, the low concentration value in the impurity concentration in the high-resistance region is preferably set to not more than $1 \times 10^{17}$ cm$^{-3}$. When the low concentration value of the first conductivity type or second conductivity type impurity in the aforementioned high-resistance region is set to not more than $1 \times 10^{17}$ cm$^{-3}$, the electric resistance can be remarkably increased due to formation of the depletion layer, or the electric resistance can be increased without forming the depletion layer.

In the transverse JFET according to the aforementioned third aspect of the present invention, the high-resistance region contains a second conductivity type impurity having a concentration value lower than the value of the first conductivity type impurity concentration of the second SiC film, for example.

Any of the following four cases corresponds to the aforementioned structure: (e) A case where the channel is of the n-type, the high-resistance region is of the p-type and the substrate (gate) is of the p-type, (f) a case where the channel is of the n-type, the high-resistance region is of the p-type and the substrate (gate) is of the n-type, (g) a case where the channel is of the p-type, the high-resistance region is of the n-type and the substrate (gate) is of the n-type, and (h) a case where the channel is of the p-type, the high-resistance region is of the n-type and the substrate (gate) is of the p-type. In the cases (e) and (g) among these, i.e., when the high-resistance region and the substrate are of the same conductivity type, no depletion layer is formed on the junction between the high-resistance region and the substrate but the aforementioned leakage current can be suppressed due to high resistance resulting from the low-concentration impurity.

In the cases (f) and (h) (when the high-resistance region and the substrate are of different conductivity types), on the other hand, a depletion layer is formed on the junction between the substrate and the high-resistance region in the ON-state. In other words, the substrate is of the p-type and forms an n-p$^-$ junction with the high-resistance region in the case (f), while the substrate is of the p-type and forms a p-n$^-$ junction with the high-resistance region in the case (h). In the case (f) (when the first conductivity type is set to the n-type), a zero or slightly plus potential is applied to the gate electrode in the ON-state. In the case (h) (when the first conductivity type is set to the p-type), a zero or slightly minus potential is applied to the gate electrode in the ON-state. At this time, it follows that a reverse bias voltage is applied to each of the aforementioned n-p⁻ and p-n⁻ junctions, to result in a depletion layer. The electric resistance of the path from the channel region toward the first SiC film is extremely increased due to this depletion layer in addition to the high resistance resulting from the low-concentration impurity.

Consequently, the wattless currents leaking from the source and channel regions to the first SiC film are suppressed and the amplification factor is prevented from reduction.

In the transverse JFET according to the aforementioned third aspect of the present invention, the high-resistance region consists of a two-layer structure of a first layer and a second layer, for example, the first layer contains a first conductivity type impurity having a concentration value lower than the value of the first conductivity type impurity concentration of the second SiC film, and the second layer contains the first conductivity type impurity having a concentration value lower than the value of the first conductivity type impurity concentration of the second SiC film.

This two-layer structure is (A) a two-layer structure of p⁻ (upper layer)/n⁻ (lower layer), or (B) a two-layer structure of n⁻ (upper layer)/p⁻ (lower layer).

In the case of the two-layer structure (A), a reverse bias voltage is applied between the upper layer and the lower layer to form a depletion layer in the ON-state. This depletion layer is formed regardless of the conductivity type of the channel region and the conductivity type of the SiC substrate.

In the case of the two-layer structure (B), a reverse bias voltage is applied to the junction between the p⁻ layer (lower layer) and the n-type SiC substrate to form a depletion layer in the ON-state when the conductivity type of the SiC substrate is the n type.

In the aforementioned case, the electric resistance is extremely increased due to formation of the depletion layer. This depletion layer is formed regardless of the conductivity type of the channel region. When the conductivity type of the SiC substrate is the p-type in the aforementioned case (B), no depletion layer is formed while both of the upper and lower layers of the aforementioned two-layer structure exhibit low impurity concentrations and hence the electric resistance reaches a high value. In the aforementioned transverse JFET, the low concentration value in the impurity concentration in the high-resistance region is preferably set to not more than $1 \times 10^{17}$ cm$^{-3}$. When the low concentration value of the first conductivity type or second conductivity type impurity in the aforementioned high-resistance region is set to not more than $1 \times 10^{17}$ cm$^{-3}$, the electric resistance can be extremely increased due to formation of the depletion layer, or the electric resistance can be increased without forming the depletion layer.

In any of the aforementioned cases, high electric resistance is so ensured that wattless currents flowing from the source and channel regions to the first SiC film can be suppressed for preventing reduction of the amplification factor.

In the transverse JFET according to the aforementioned third aspect of the present invention, the high-concentration impurity region and the channel region are so formed that a depletion layer resulting from a built-in potential shuts off the channel region.

According to the aforementioned structure, normally off operation can be carried out. When the gate potential is set to zero with respect to the source potential (ground potential in general), the channel region is deenergized by the depletion layer extending from the junction between the same and the high-concentration impurity region due to the built-in potential. Therefore, the JFET enters an OFF-state with the gate potential of zero. In order to bring the JFET into an ON-state, a prescribed plus potential may be applied. When no depletion layer grows as described above with the built-in potential, it follows that the JFET carries out normally on operation. In other words, carriers unrestrictedly move in the channel region with the gate potential of zero, while a minus potential is applied to the gate electrode for applying a high reverse bias potential for attaining an OFF-state. When the JFET carrying out normally on operation is loaded on a rotary machine, power is supplied to the rotary machine also when a peripheral circuit breaks down, and hence a counter control circuit must be provided for preventing danger. When the normally on operation is set as described above, the aforementioned control circuit is unnecessary. Whether to perform normally on operation or normally on operation can be set in response to the ratios of the impurity concentrations in the channel region and the high-concentration impurity region, the length of the high-concentration impurity region, the thickness of the channel region or the like. As hereinabove described, the normally off operation can be readily attained as the ratio between the second conductivity type impurity concentration in the high-concentration impurity region and the first conductivity type impurity concentration in the channel region is increased. In this description, the normally on operation is assumed unless the normally off operation is stated in particular.

In the transverse JFET according to the aforementioned third aspect of the present invention, the channel region can contain a first conductivity type impurity of a higher concentration than the impurity concentration of portions of the first conductivity type SiC film located on both sides thereof, for example.

According to this structure, the depletion layer is formed to block the sections of the channel from both sides of the channel region to attain the OFF-state so that the portion of this depletion layer withstands the voltage, whereby ON-state resistance can be reduced without reducing the withstand voltage of the transverse JFET. Therefore, this transverse JFET, consuming no power also when fed with a large current, can be applied to a switching element having low loss and high withstand voltage.

The transverse JFET according to the aforementioned third aspect of the present invention can have a conductor film arranged in contact with the face of the channel region, for example.

According to the aforementioned structure, influence exerted on the transistor characteristics is small also when the impurity concentration of the channel region or the thickness of the channel region is dispersed, and influence by dispersion of these factors substantially causes no problem. When the aforementioned conductor film is so arranged that side portions thereof are not in contact with portions of the first conductivity type semiconductor layer holding the channel region therebetween in the OFF-state, for example, on the other hand, not only the channel region but also the conductor film is deenergized due to the aforementioned deenergization. Consequently, the OFF-state can be readily implemented.

When the transverse JFET according to the aforementioned third aspect of the present invention has the conductor film, the length of the conductor film along the channel length direction can be rendered smaller than a channel length, for example.

According to this structure, at least an end of the conductor film is insulated from a side wall, whereby the JFET can be turned off by deenergizing the channel region on the side where the depletion layer is insulated.

When the transverse JFET according to the aforementioned third aspect of the present invention has the conductor film, the thickness of the channel region can be rendered smaller than the width of a depletion layer in the first conductivity type SiC film resulting from a built-in potential on the junction between the second conductivity type SiC film and the said first conductivity type SiC film formed on the second conductivity type SiC film.

According to the aforementioned structure, a normally off JFET can be obtained and employed for controlling a rotary machine or the like with no countermeasure against breakdown of the gate circuit. Further, power consumption can be reduced in the ON-state, and influence by dispersion of the impurity concentration of the channel region or the like can also be avoided.

When the transverse JFET according to the aforementioned third aspect of the present invention has the conductor film, the conductor film can be formed by either a metal film or a semiconductor film containing a high-concentration impurity.

According to the aforementioned structure, a parallel bypass of low resistance can be simply provided on the channel region with a metal film of low resistance. The metal film may be made of any material so far as the same serves as an electrode material, while aluminum (Al) or an aluminum alloy is desirable in consideration of easiness of etching and high conductivity.

BEST MODES FOR CARRYING OUT THE INVENTION

Embodiments of the present invention are now described with reference to the drawings.

First Embodiment

Figure 1:
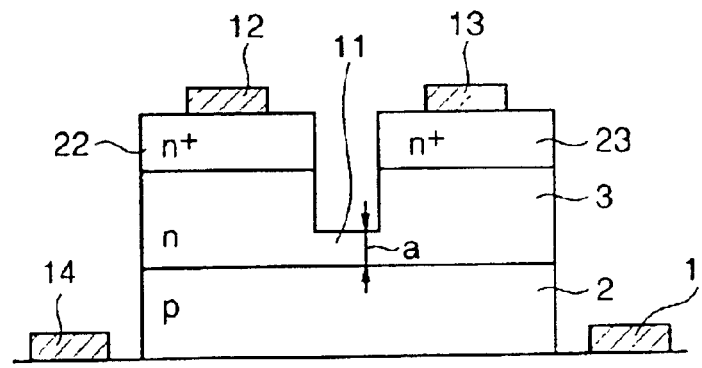
FIG. 1 is a sectional view of a transverse JFET according to a first embodiment of the present invention.

FIG. 1 is a sectional view of a transverse JFET according to a first embodiment of the present invention. A p-type SiC film 2 is formed on an n-type SiC substrate in, and an n-type SiC film 3 reduced in thickness in a portion of a channel region 11 is formed thereon. On the n-type SiC film, n$^+$-type impurity layers defining a source region 22 and a drain region 23 are formed on opposite sides of the channel region 11. A source electrode 12 and a drain electrode 13 form ohmic contact with the source region 22 and the drain region 23 respectively. According to this embodiment, gate electrodes 14 are formed on a front or top surface of the substrate 1 with the source and drain regions 22 and 23 therebetween in plane. The feature of the aforementioned structure resides in the multilayer structure of the n-type SiC substrate/(L) multilayer junction/p-type SiC film/(G) gate junction/n-type SiC film having the channel region.

(A) A normally on JFET can perform high-speed switching for high power with a high yield due to employment of the aforementioned structure. (B) On the other hand, a normally off JFET is so structured that the thickness of a depletion layer exceeds the thickness a of the channel due to spreading of the width of the depletion layer toward the n-type SiC film resulting from a built-in potential in the aforementioned p-n junction. Therefore, the n-type impurity concentration of the n-type SiC film 3 including the channel region is set to 1×10$^{16}$ cm$^{-3}$, and the thickness a of the channel is set to not more than 500 nm, for example. This operation of the normally off JFET is performed as follows:

(B-1): When the JFET is off, i.e., when the potentials of the gate electrodes are zero, a diffusion voltage is applied to the gate junction to form a depletion layer. In this junction, the impurity concentration of the p-type SiC film is increased for suppressing the depletion layer in application of a reverse bias voltage to the (L) multilayer junction. Thus, the impurity concentration is set higher than the n-type impurity concentration in the channel region as a matter of course, and hence the depletion layer widely extends toward the channel region with a small width of extension toward the p-type SiC film. Thus, the depletion layer can block only the channel region by adjusting the impurity concentration. Consequently, the OFF-state is implemented.

(B-2): When the JFET is on, i.e., when the gate voltage is plus, a forward bias voltage is applied to the (G) gate junction, no depletion layer is formed, and the ON-state is implemented. When the potentials of the gate electrodes are plus, a reverse bias voltage is applied to the aforementioned (L) multilayer junction. However, both of the p-type impurity concentration of the p-type SiC film and the n-type impurity concentration of the n-type SiC substrate are so increased that the width of a depletion layer is small and a current flows due to tunneling. As to the aforementioned high impurity concentrations, the n-type impurity concentration of the n-type SiC substrate 1n is set to about 1×10$^{19}$ cm$^{-3}$, and the p-type impurity concentration of the p-type SiC film is set to about 1×10$^{19}$ cm$^{-3}$. Since the impurity concentrations are increased as described above, the withstand voltage on the junction may be so reduced that withstand voltage disappears to allow a current flow. Therefore, the depletion layer in the aforementioned junction hardly influences on on-off action of the JFET.

According to the structure of the transverse JFET in the aforementioned first embodiment, a high-power JFET having a high switching speed can be prepared with a high yield by employing electrons having high mobility as carriers in the channel region while employing an n-type SiC substrate having low defect density. The yield of the JFET according to the aforementioned embodiment in a prototype stage was as follows: For the purpose of comparison, the yield of a conventional JFET is also shown.

Inventive Sample: preparation on an n-type SiC substrate (first embodiment): yield 90%

Conventional Sample: preparation on a p-type SiC substrate: yield 10%

From the aforementioned results, it is understood that the yield of the JFET according to this embodiment is remarkably improved.

Second Embodiment

Figure 2:
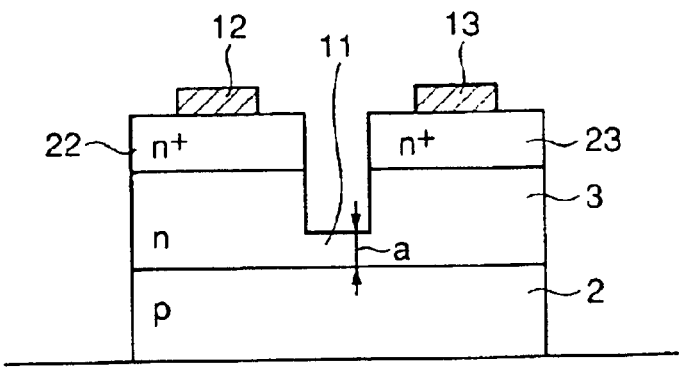
FIG. 2 is a sectional view of a transverse JFET according to a second embodiment of the present invention.

FIG. 2 is a sectional view showing a transverse JFET according to a second embodiment of the present invention. This embodiment is remarkably different from the JFET according to the first embodiment in a point that a gate electrode 14 is arranged on the back side of an n-type SiC substrate in. Operation and functions relevant to the remaining parts are identical to the operation and functions shown in the first embodiment. According to this embodiment, the gate electrode 14 is arranged on the back side of the n-type SiC substrate, whereby a channel region 11 can be linearly and widely seen through from the gate electrode 14 to the front face. Therefore, a signal applied to the gate electrode is linearly and widely transmitted to the channel region, whereby the JFET can perform on-off action at a high speed. In other words, the JFET can implement a high-speed switching element. Further, the planar size is reduced in the JFET according to the second embodiment as compared with the arrangement of the gate electrodes in the first embodiment, to exhibit stereoscopic arrangement. Thus, the degree of integration of the JFET can be improved.

Third Embodiment

Figure 3:
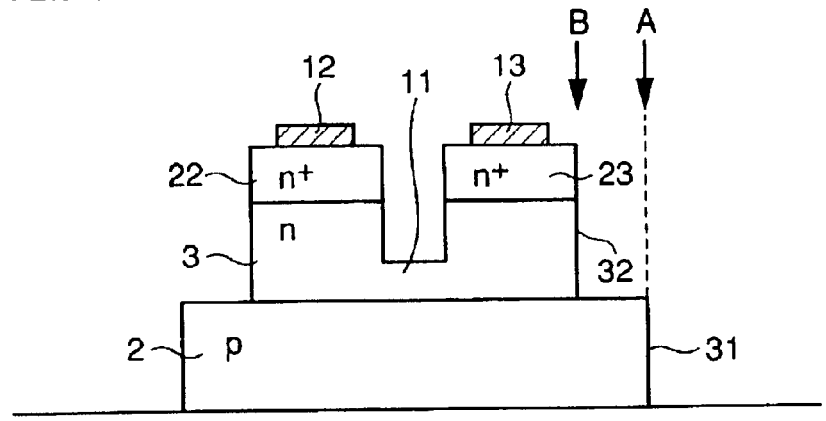
FIG. 3 is a sectional view of a transverse JFET according to a third embodiment of the present invention.
Figure 3:
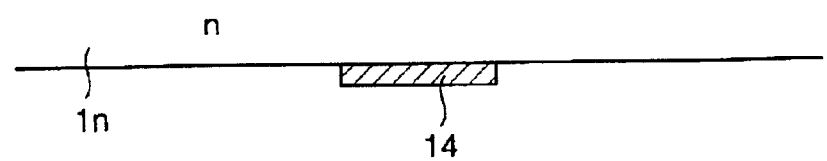
Figure 4:
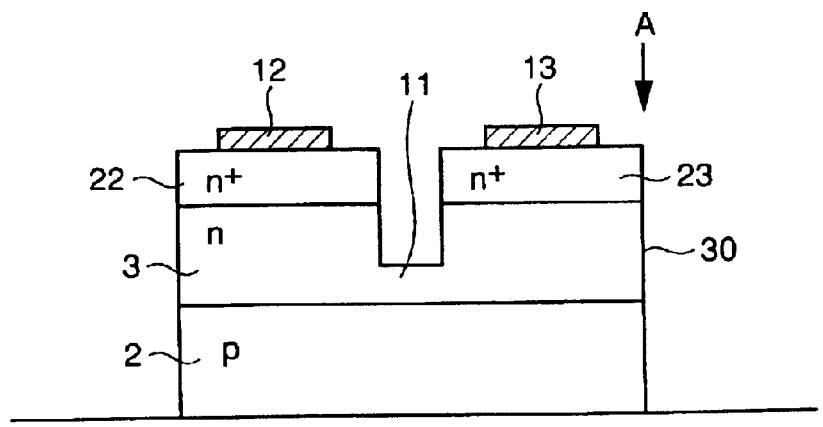
FIG. 4 is a sectional view of a comparative JFET for the transverse JFET according to the third embodiment of the present invention.
Figure 4:
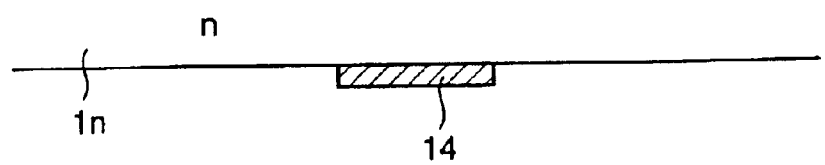

FIG. 3 is a sectional view showing a transverse JFET according to a third embodiment of the present invention. FIG. 4 is a sectional view of a JFET to be compared therewith. According to this embodiment, an end face 31 of a p-type SiC film 2 and an end face 32 of an n-type SiC film 3 formed thereon are so misaligned with each other that the former is located inward beyond the latter in plane. Referring to FIG. 4, on the other hand, both end faces are formed as aligned end faces 30. In this case, the end faces 30 are so exposed to ions during RIE that crystals may be damaged when etched by RIE. In the case of the end face structure shown in FIG. 3, on the other hand, the end face of the n-type SiC film is etched by first etching A, while the inner portion is etched and exposed by second etching B and hence this portion is exposed to an ion atmosphere for only a short period. Therefore, such a possibility that crystals around the end face 32 are damaged by ions is extremely reduced. Thus, a JFET having excellent transistor characteristics can be obtained while ensuring a high yield.

Figure 5:
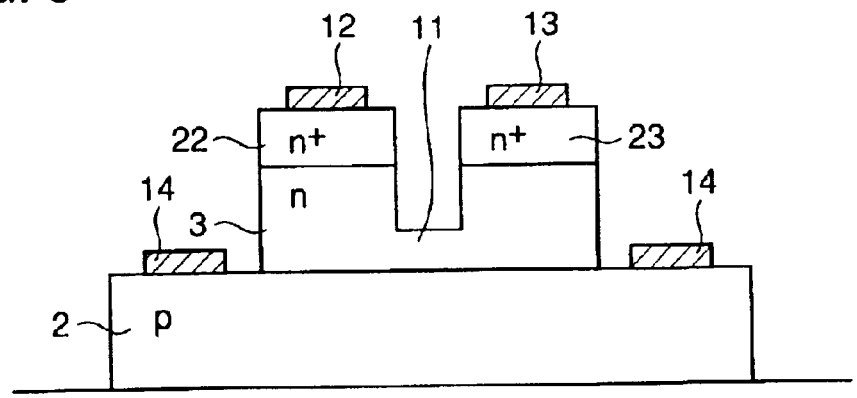
FIG. 5 is a sectional view of another transverse JFET according to the third embodiment of the present invention.
Figure 5:

While the JFET shown in FIG. 3 has a back gate structure, a JFET having a structure arranging gate electrodes 14 on side portions of a channel is also an influential structure of the present invention. In other words, a JFET exhibiting a high yield can be obtained without damaging surface crystals on end portions by employing the structure shown in FIG. 5.

Fourth Embodiment

Figure 6:
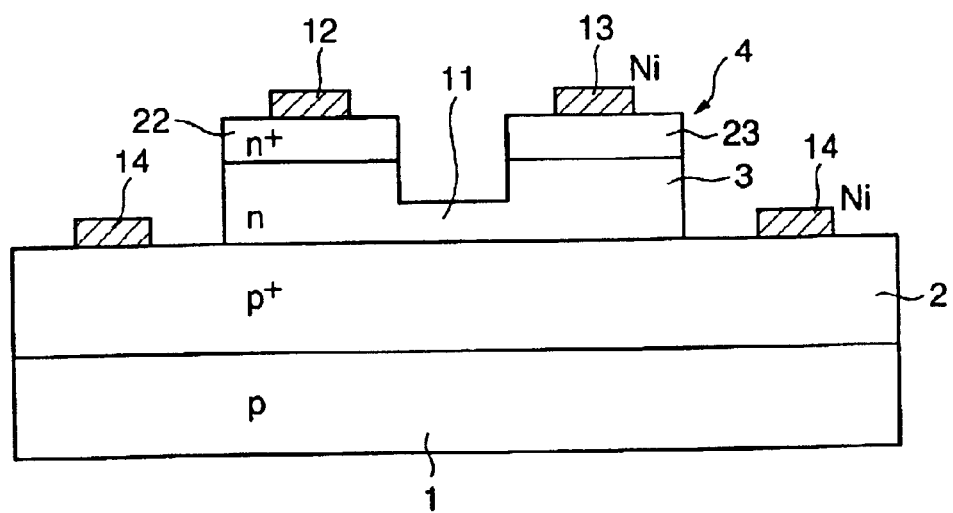
FIG. 6 is a sectional view of a transverse JFET according to a fourth embodiment of the present invention.

FIG. 6 is a sectional view of a transverse JFET according to a fourth embodiment. Referring to FIG. 6, a p$^+$-type SiC film 2 is formed on an SiC substrate 1. The SiC substrate 1 and the p$^+$-type SiC film 2 may be either of 6H or of 4H. An n-type SiC film 3 formed with a channel region is formed on the aforementioned p+-type SiC film 2. The n-type SiC film 3 is reduced in thickness at the center, for defining the channel region 11. A source electrode 12 and a drain electrode 13 are formed on a source region and a drain region, which are n+-type SiC films 4 located above both side portions of the channel respectively. Ends of the p+-type SiC film 2 are not covered with the upper n-type SiC film 3 but two gate electrodes 14 are formed on the uncovered relatively wide single plane to hold the source electrode 12 and the drain electrode 13 formed above the center therebetween. In other words, conductive paths between the source and drain regions and the gate electrodes have no portions narrowly necked by trenches or the like partway but communicate with each other with wide sections. The n-type impurity concentrations of the source region and the drain region are set high to attain ohmic contact with Ni or the like. The impurity concentrations of the respective regions are preferably set as follows, for example:

The channel region 11 and the n-type SiC film 3: n-type impurity $2 \times 10^{17}$ cm$^{-3}$ The source and drain regions (n+-type SiC films) 4: n-type impurity $> 1 \times 10^{19}$ cm$^{-3}$ The p+-type SiC film 2: p-type impurity $> 1 \times 10^{19}$ cm$^{-3}$ As to the channel region, the thickness a, the length L and the width w in a direction perpendicular to the plane of FIG. 6 can be decided in response to the size of the element. All of the source electrode 12 and the source region 22, the drain electrode 13 and the drain region 23 and the gate electrodes 14 and the p+-type SiC film 2 defining the gate region are connection of high-concentration regions having impurity concentrations exceeding $1 \times 10^{19}$ cm$^{-3}$ and metal films, and hence ohmic contact can be formed by employing Ni as the material for the metal films, for example.

In order to attain an OFF-state, a reverse bias voltage is applied to the gate electrodes 14 for extending a depletion layer from a p-n junction under the channel region 11 toward the channel region 11 and blocking the section of the channel region. In a broad way, gate resistance Rg is formed between the gate electrodes and the lower end of the center of the depletion layer, and the capacitance of the depletion layer can be regarded as the gate capacitance Cg. In order to attain an ON-state, the reverse bias may be canceled for eliminating the depletion layer. In the ON-state, carriers flow from the source electrode toward the drain electrode through the channel region 11. When repeating on-off action, the aforementioned gate resistance Rg and the gate capacitance Cg can be regarded as serially connected, and a rise (fall) time is proportionate to RgCg, which is the time constant in a transient phenomenon of this circuit. Therefore, the rise (fall) time in switching can be reduced by reducing the gate resistance Rg.

When the structure of the transverse JFET shown in FIG. 6 is employed, a JFET having stable performance can be provided by improving withstand voltage without increasing on-state resistance and reducing a switching response time. This JFET, providing simple and easy fabrication steps and hardly causing trouble such as reduction of the yield, can be fabricated at a low cost as a result.

Example Corresponding to Fourth Embodiment

Figure 7:
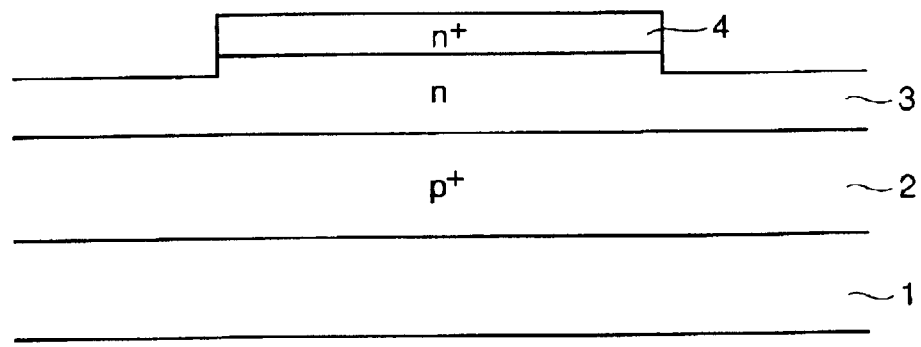
FIG. 7 is a sectional view of a stage forming an $n^+$ SiC film and patterning the same by RIE in an intermediate fabrication stage for the transverse JFET shown in FIG. 6.
Figure 8:
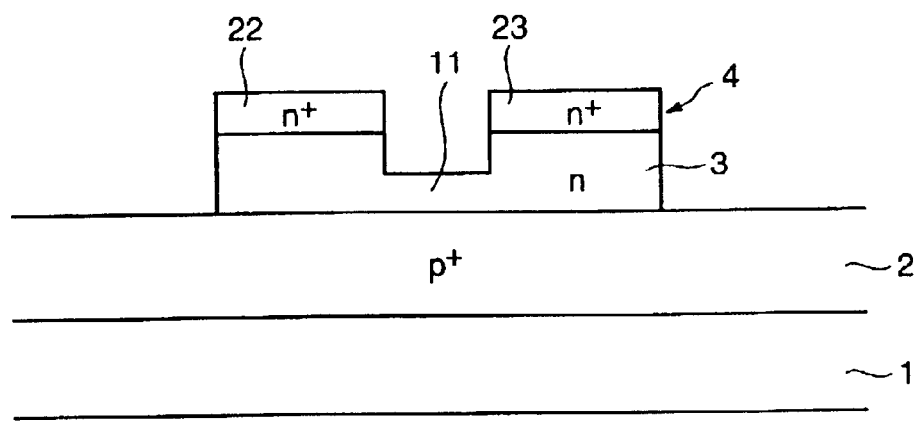
FIG. 8 is a sectional view of a stage forming a channel region by RIE after the stage shown in FIG. 7.
Figure 9:
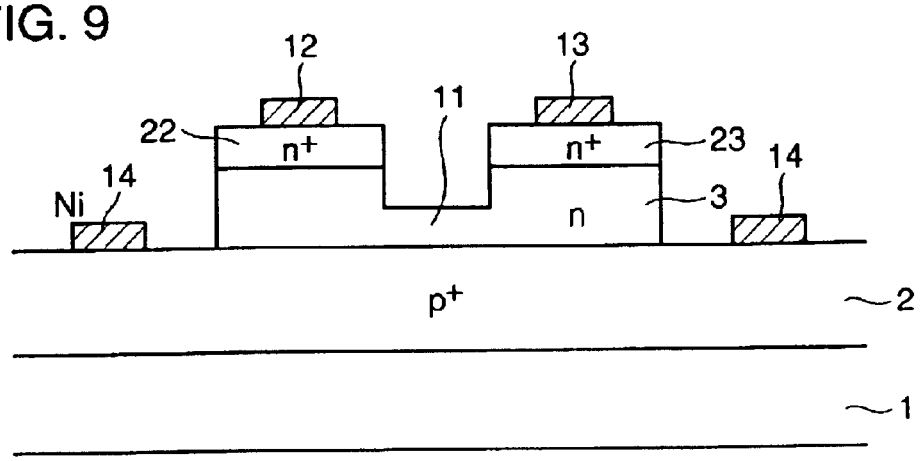
FIG. 9 is a sectional view of a stage forming an Ni film for forming electrodes after the stage shown in FIG. 8.

A transverse JFET employing the structure shown in FIG. 6 was fabricated. In the channel region 11, the channel length L was set to 10 μm, the channel thickness a was set to 300 nm (0.3 μm), and the channel width w perpendicular to the plane of FIG. 6 was set to 700 μm. FIGS. 7 to 9 are diagrams illustrating inventive steps corresponding to FIGS. 36 to 39 illustrating the method of fabricating the conventional transverse JFET.

Figure 35:
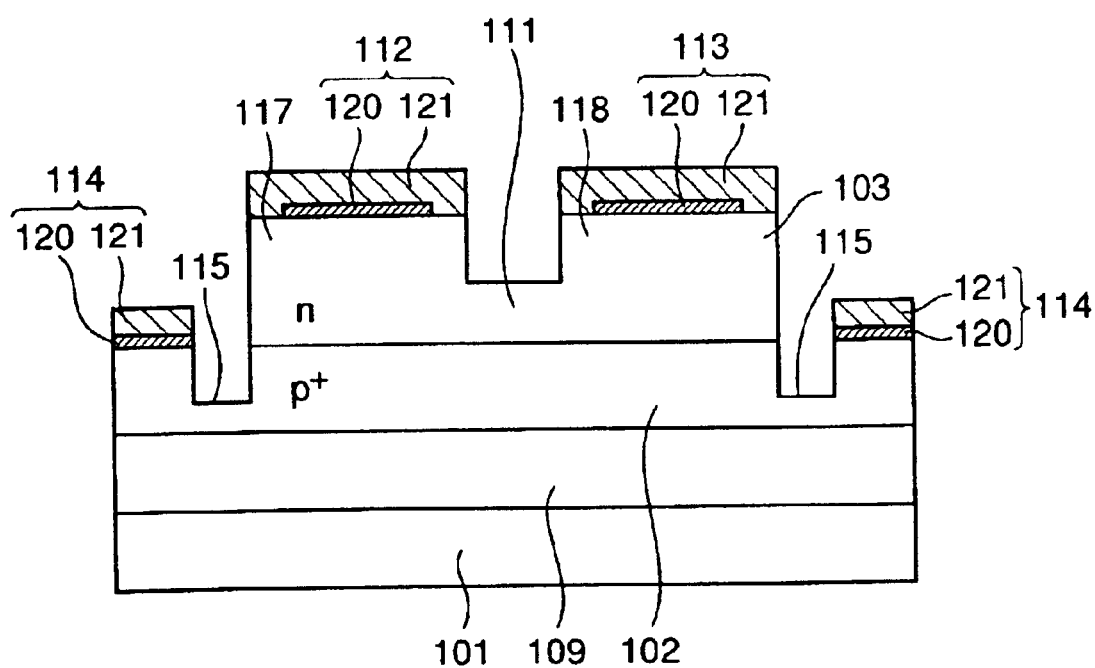
FIG. 35 is a sectional view of another conventional transverse JFET.
Figure 36:
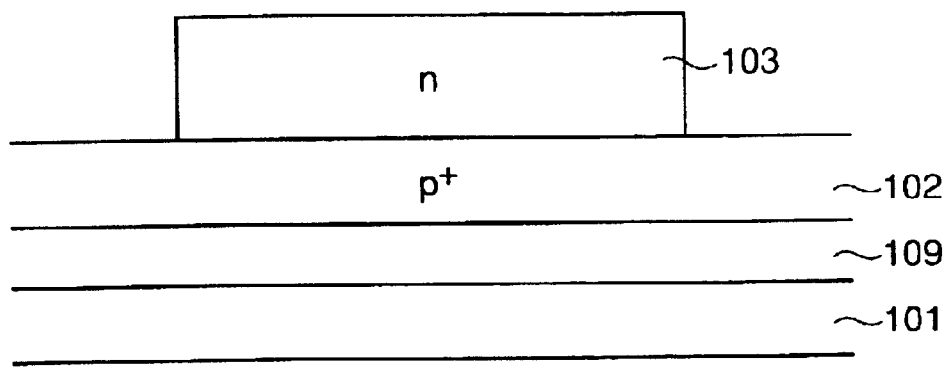
FIG. 36 is a sectional view of a stage forming an n-channel layer in an intermediate fabrication stage for the transverse JFET shown in FIG. 35.
Figure 37:
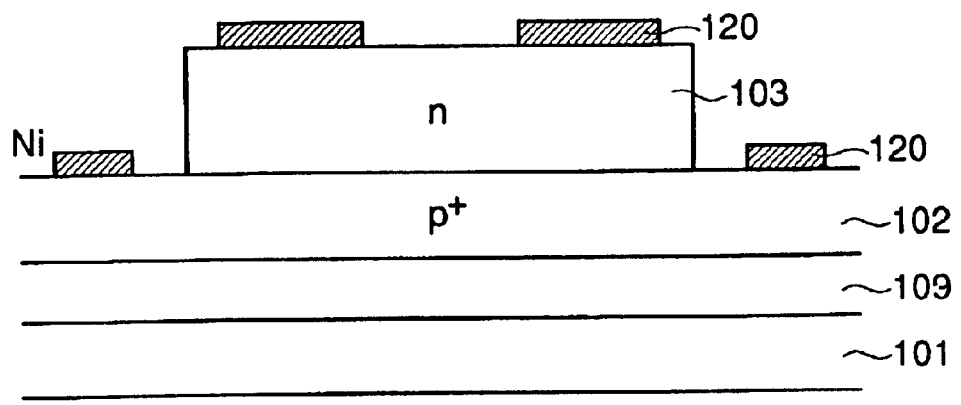
FIG. 37 is a sectional view of a stage forming an Ni film defining a first layer of a two-layer electrode after the stage shown in FIG. 36.
Figure 38:
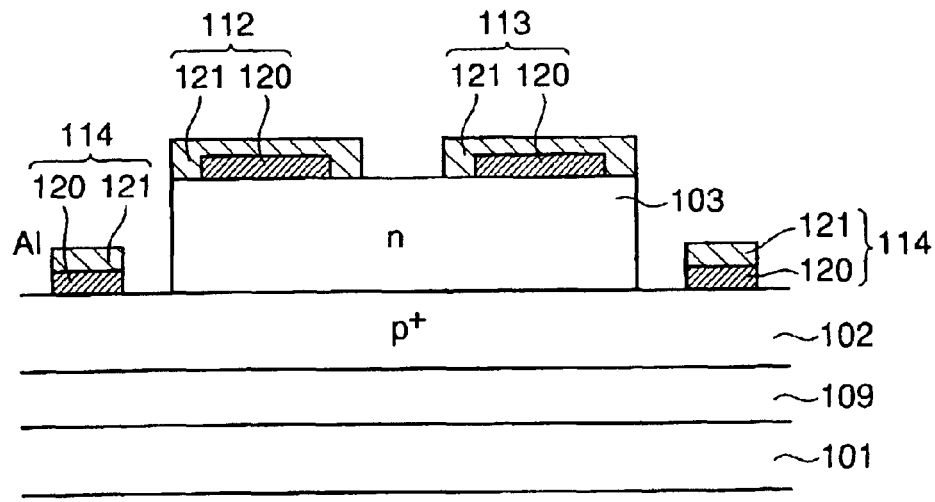
FIG. 38 is a sectional view of a stage forming an Al film defining a second layer of the two-layer electrode after the stage shown in FIG. 37.
Figure 39:
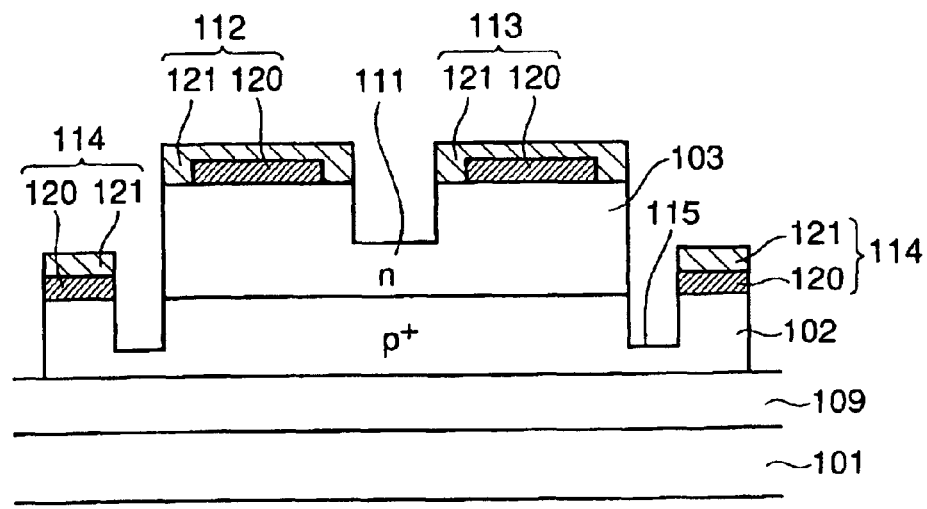
FIG. 39 is a sectional view of a stage providing a trench between a gate region and a central portion after the stage shown in FIG. 38.

First, a p+-type SiC film is formed on a p-type SiC substrate by a thickness of 1 μm, followed by formation of an n-type SiC film. An n+-type SiC film is further formed thereon followed by etching by RIE, for patterning a region including source and drain regions. The center of the portion including the source and drain regions is etched by RIE for providing a trench thereby isolating the source region 22 and the drain region 23 from each other (FIG. 8). Further, the gate electrodes are provided on the p+-type SiC film 2, while the source electrode 12 and the drain electrode 13 are provided on the source region 22 and the drain region 23 which are n+ impurity regions respectively (FIG. 9). Thereafter no etching step is provided for providing trenches in the p+-type SiC film 2. In the comparative transverse JFET, impurity concentrations were not particularly increased in both of the source region and the drain region but left at the concentration of $2 \times 10^{17}$ cm$^{-3}$ of the n-type SiC film 3, as shown in FIG. 35. A transverse JFET setting the depth of the trenches in the p-type SiC film shown in FIG. 35 to 0.7 μm and setting the thickness of p-type SiC film remaining on the bottom portion to 0.3 μm was also prototyped as comparative example.

Rise (fall) times in switching were measured as to both transverse JFETs. Table 1 shows results of measurement normalizing the rise time in comparative example to 1.

TABLE 1

| Transverse JFET Structure | Rise (Fall) Ratio (trenched:1) |
|---|---|
| Untrenched (Inventive Example) | 0.33 |
| Trenched (Comparative Example) | 1 |

As shown in Table 1, it was possible to reduce the switching rise (fall) time to ⅓ by forming the p-type SiC film 2 as an untrenched smooth plane and forming the gate electrodes 14 thereon. Consequently, it has been rendered possible to obtain a transverse JFET having a high withstand voltage and low ON-state resistance and capable of high-speed switching.

Fifth Embodiment

Figure 10:
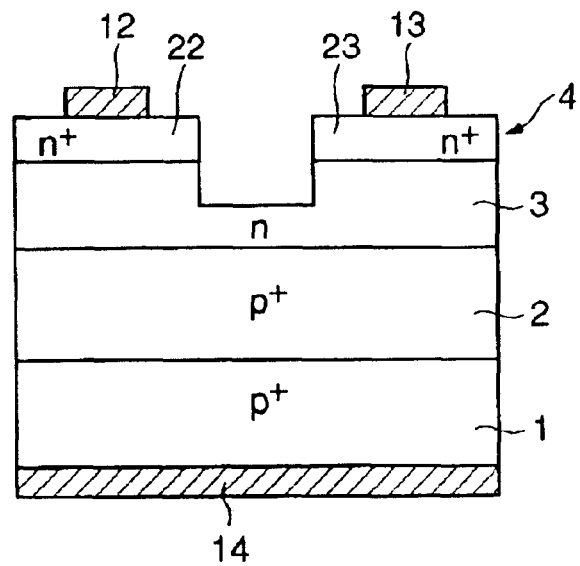
FIG. 10 is a sectional view of a transverse JFET according to a fifth embodiment of the present invention.

FIG. 10 is a sectional view of a transverse JFET according to a fifth embodiment of the present invention. The impurity concentrations of portions other than a gate electrode are identical to those of the transverse JFET shown in FIG. 6. FIG. 10 is characterized in that the gate electrode 14 is formed over the back side of a p-type SiC substrate 1. According to the structure shown in FIG. 10, ON- and OFF-states can be implemented by the same manner of applying a gate voltage as that in FIG. 6. Further, gate resistance Rg can be further reduced, and a rise (fall) time in switching can consequently be reduced. A fabrication method is also simplified, and the yield can be improved.

Sixth Embodiment

Figure 11:
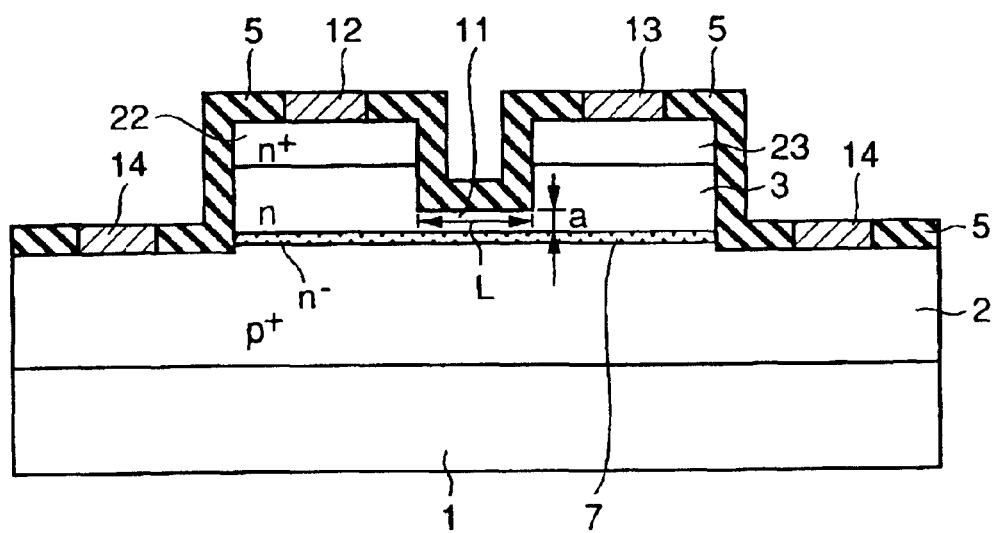
FIG. 11 is a sectional view of a transverse JFET according to a sixth embodiment of the present invention.

FIG. 11 is a sectional view of a transverse JFET according to a sixth embodiment. Referring to FIG. 11, a p+-type SiC film 2 is formed on an SiC substrate 1. On the aforementioned p+-type SiC film 2, a low-concentration layer 7 containing an n-type impurity of a lower concentration than a channel region is interposed between an n-type SiC film and the p+-type SiC film 2 so that there is no portion where these films 3 and 2 are in contact with each other. The channel region 11 is formed on the said low-concentration layer 7 at the center. A source electrode 12 and a drain electrode 13 are formed on a source region and a drain region which are n⁺ SiC films 4 located above both sides of the channel as viewed from the channel region respectively. Ends of the p⁺-type SiC film 2 are not covered with the upper n-type SiC film 3 but two gate electrodes 14 are formed on the uncovered relatively wide single plane to hold the source electrode 12 and the drain electrode 13 formed above the center therebetween. In other words, conductive paths between the source and drain regions and the gate electrodes have no portions narrowly necked by trenches or the like partway but communicate with each other with wide sections. The impurity concentrations of the respective regions are preferably set as follows, for example:

The channel region 11: n-type impurity $2 \times 10^{17}$ cm$^{-3}$

The source and drain regions (n⁺-type SiC films) 4: n-type impurity $> 1 \times 10^{19}$ cm$^{-3}$ The low-concentration layer 7: n-type impurity $< 2 \times 10^{17}$ cm$^{-3}$ The p⁺-type SiC film 2: p-type impurity $> 1 \times 10^{19}$ cm$^{-3}$ As to the channel region, the thickness a, the length L and the width w in a direction perpendicular to the plane of FIG. 11 can be decided in response to the size of the element. Except the portions of the electrodes 12, 13 and 14, the face is covered with a protective film 5 consisting of $SiO_2$. All of the source electrode 12 and the source region 22, the drain electrode 13 and the drain region 23 and the gate electrodes 14 and the p⁺-type SiC film 2 defining the gate region are connection of high-concentration regions having impurity concentrations exceeding $1 \times 10^{19}$ cm$^{-3}$ and metal films, and hence ohmic contact can be formed by employing Ni as the material for the metal films and performing heat treatment, for example.

Referring to FIG. 11, a forward bias voltage is applied to the gate electrodes in an ON-state, and no depletion layer is formed in the channel region 11. Therefore, carriers flow through a path reaching the drain region through the source region and the channel region. This path has no factor increasing ON-state resistance in particular, leading to no power consumption. When a reverse bias voltage is applied to the gate electrodes 14, a depletion layer extends toward the channel region from a p-n junction under the channel region and finally completely blocks the channel portion, for implementing an OFF-state. When no trenches are provided in the p-type SiC film 2 as in the present invention, gate resistance is so small that the rise (fall) time is reduced in repetition of this on-off action.

When the structure of the transverse JFET shown in FIG. 11 is employed, a JFET having stable performance can be provided by improving withstand voltage without increasing on-state resistance and reducing a switching response time. This JFET, providing simple and easy fabrication steps and hardly causing trouble such as reduction of the yield, can be fabricated at a low cost as a result.

Example 1 Corresponding to Sixth Embodiment

A transverse JFET employing the structure shown in FIG. 11 was fabricated. The structures of respective regions of portions excluding the channel region 11 and the low-concentration layer 7 are as described above. In the channel region 11, the channel length L was set to 10 μm, the channel thickness a was set to 300 nm (0.3 μm), and the channel width w perpendicular to the plane of FIG. 11 was set to 700 μm. The impurity concentration of the low-concentration layer (n-impurity layer) was set to $1 \times 10^{15}$ cm$^{-3}$, and the thickness was set to 0.1 μm.

Figure 12:
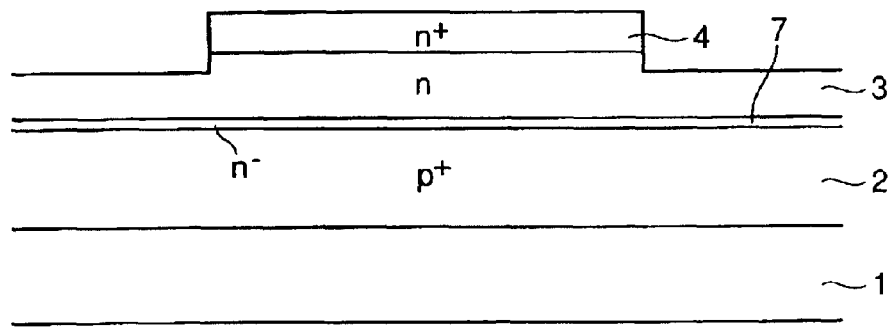
FIG. 12 is a sectional view of a stage forming an $n^+0$ SiC film and patterning the same by RIE in an intermediate fabrication stage for the transverse JFET shown in FIG. 11.
Figure 13:
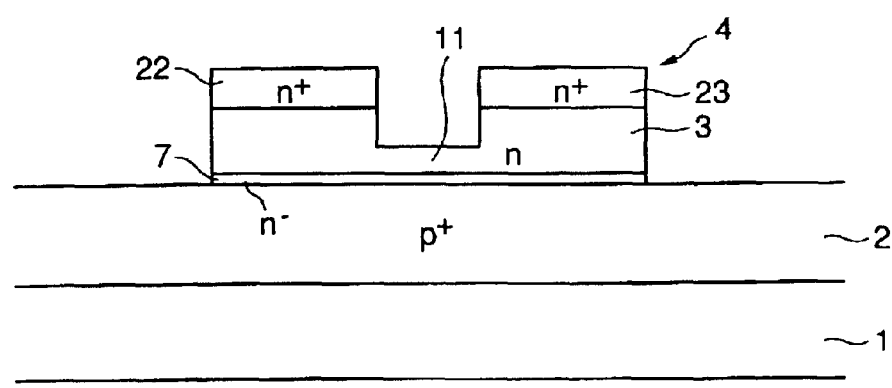
FIG. 13 is a sectional view of a stage forming a channel region by RIE after the stage shown in FIG. 12.
Figure 14:
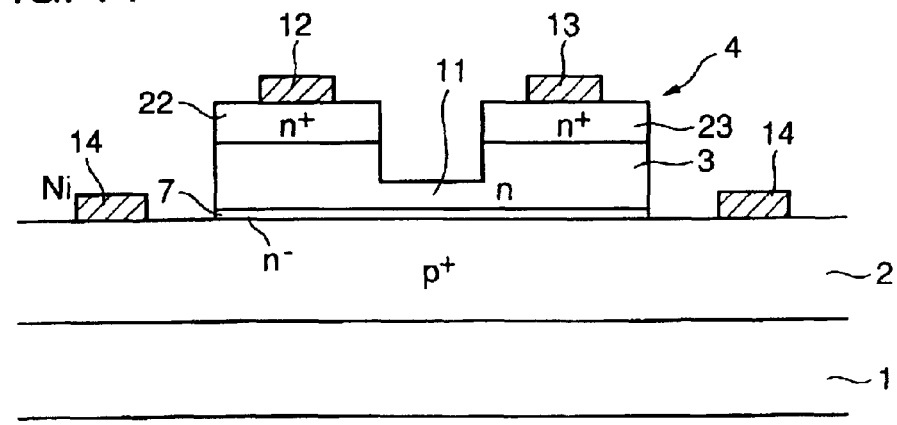
FIG. 14 is a sectional view of a stage forming an Ni film for forming electrodes after the stage shown in FIG. 13.

FIGS. 12 to 14 are diagrams illustrating a method of fabricating the inventive transverse JFET corresponding to FIGS. 36 to 39 illustrating the method of fabricating the conventional transverse JFET. First, a p⁺-type SiC film 2 is formed on a p-type SiC substrate 1 followed by formation of a low-concentration n-type SiC film 7, and an n-type SiC film 3 is formed thereon. Further, an n⁺-type SiC film 4 is formed thereon, followed by etching by RIE, for patterning a region including source and drain regions (FIG. 12). The center of the portion including the source and drain regions is etched by RIE for providing a trench thereby isolating the source region 22 and the drain region 23 from each other (FIG. 13). Further, the gate electrodes are provided on the p⁺-type SiC film 2, while the source electrode 12 and the drain electrode 13 are provided on the source region 22 and the drain region 23 which are n⁺ impurity regions respectively (FIG. 14). Thereafter no etching step is provided for providing trenches in the p⁺-type SiC film 2. A transverse JFET having the structure shown in FIG. 35 was also prepared for the purpose of comparison. In the comparative transverse JFET, impurity concentrations were not particularly increased in both of the source region and the drain region but left at the concentration of $2 \times 10^{17}$ cm$^{-3}$ of the n-type SiC film 3. Table 2 shows results of measurement of withstand voltages and ON-state resistance values as to these two transverse JFETs.

TABLE 2

| Transverse JFET Structure | Withstand Voltage (V) | ON-State Resistance (mΩ·cm²) |
|---|---|---|
| With Low-Concentration Layer (Inventive Example) | 250 | 8.7 |
| With No Low-Concentration Layer (Comparative Example) | 250 | 10.0 |

As shown in Table 2, it was possible to reduce the ON-state resistance from 10 mΩ·cm² to 8.7 mΩ·cm² while keeping a high withstand voltage of 250 V.

Example 2 Corresponding to Sixth Embodiment

The structure of the aforementioned transverse JFET according to the sixth embodiment was employed for measuring the rise (fall) time upon voltage application as the index of a response speed of a switching element while varying only the p-type impurity concentration of the p-type SiC film. Ni films were employed for the electrodes for forming ohmic contact between the p-type impurity region and the ohmic contact. Table 3 shows the results of measurement.

TABLE 3

| Impurity Concentration of P-Type SiC Film (/cm³) | Rise (Fall) Time (ns) |
|---|---|
| $1 \times 10^{18}$ | 2000 |
| $1 \times 10^{19}$ | 200 |
| $1 \times 10^{20}$ | 20 |
| $1 \times 10^{21}$ | 2 |

As shown in Table 3, the p-type impurity concentration and the aforementioned rise time are in inverse-proportional relation, and the rise (fall) time tends to be reduced as the p-type impurity concentration is increased.

Seventh Embodiment

Figure 15:
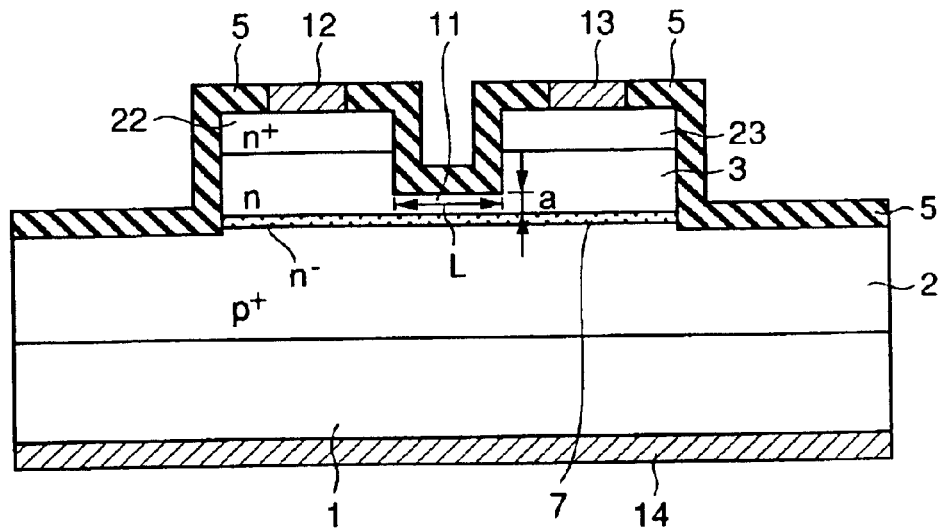
FIG. 15 is a sectional view of a transverse JFET according to a seventh embodiment of the present invention.

FIG. 15 is a sectional view of a transverse JFET according to a seventh embodiment of the present invention. FIG. 15 is characterized in that a gate electrode is formed over the back side of a p-type SiC substrate. According to the structure shown in FIG. 15, gate resistance Rg can be reduced, and a rise (fall) time in switching can be reduced as a result. Further, a fabrication method is also rendered simple and easy, for improving the yield.

Eighth Embodiment

Figure 16:
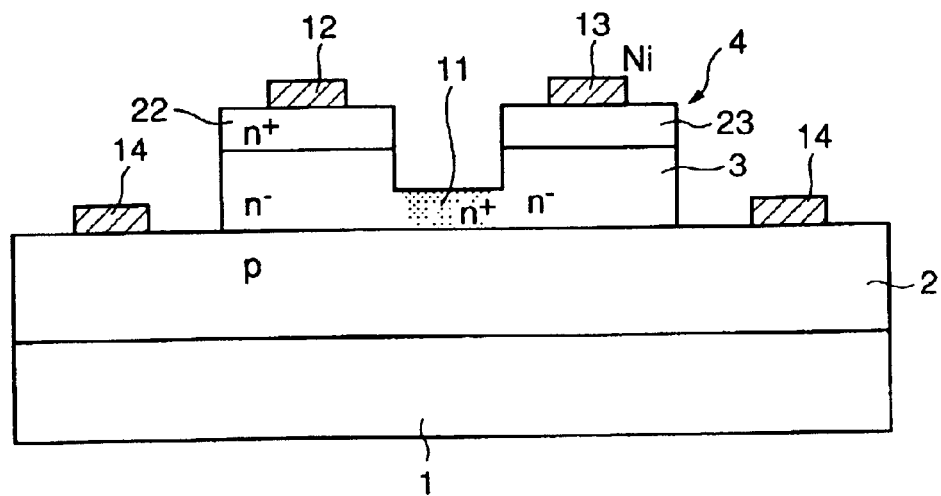
FIG. 16 is a sectional view of a transverse JFET according to an eighth embodiment of the present invention.

FIG. 16 is a sectional view of a transverse JFET according to an eighth embodiment of the present invention. Referring to FIG. 16, a 6H-p$^+$-type SiC film 2 is formed on a 6H—SiC substrate 1. A 4H-type substrate can be employed in place of the 6H-type substrate, as a matter of course. "6H—" or "4H—" is omitted in the following description. Referring to FIG. 16, a channel region 11 contains an n-type impurity in a higher concentration than the impurity concentration of portions of an n-type SiC film 3 located on both sides thereof. A source electrode 12 and a drain electrode 13 are formed on a source region and a drain region which are n$^+$ SiC films 4 located above both sides of the channel as viewed from the channel region 11 respectively. Ends of the p$^+$-type SiC film 2 are not covered with the upper n-type SiC film 3 but two gate electrodes 14 are formed on the uncovered relatively wide single plane to hold the source electrode 12 and the drain electrode 13 formed above the center therebetween. In other words, conductive paths between the source and drain regions and the gate electrodes have no portions narrowly necked by trenches or the like partway but communicate with each other with wide sections. The impurity concentrations of the respective regions are set as follows, for example:

The channel region 11: n-type impurity>1×10$^{18}$ cm$^{-3}$

The portions of the n-type SiC film 3 located on both sides of the channel region: n-type impurity 2×10$^{17}$ cm$^{-3}$ The source and drain regions (n$^+$-type SiC films) 4: n-type impurity>1×10$^{19}$ cm$^{-3}$ The p-type SiC film 2: p-type impurity>1×10$^{19}$ cm$^{-3}$ As to the channel region, the thickness a, the length L and the width w in a direction perpendicular to the plane of FIG. 16 can be decided in response to the size of the element. The source electrode 12 and the source region 22 as well as the drain electrode 13 and the drain region 23 are connection of high-concentration regions having impurity concentrations exceeding 1×10$^{19}$ cm$^{-3}$ and metal films, and hence ohmic contact can be formed by employing Ni as the material for the metal films, for example. Further, connection between the gate electrodes 14 and the p-type SiC film 2 defining the gate region is also connection of high-concentration regions having impurity concentrations exceeding 1×10$^{19}$ cm$^{-3}$ and a metal film, and hence ohmic contact can be formed by employing Ni as the material for the metal film and performing heat treatment, for example.

In an ON-state of this transverse JFET, carriers flow through a path reaching the drain region 23 from the source electrode 12 through the source region 22 and the channel region 11. In this path, the channel region has a high impurity concentration despite the small sectional area, whereby resistance can be reduced, ON-state resistance is reduced, and power consumption can be reduced. Also when a high current is fed, therefore, power loss is so small that heat generation can be suppressed. In order to attain an OFF-state, a reverse bias voltage is applied to the gate electrodes 14 for forming a depletion layer on an n-type SiC film side of a p-n junction. This depletion layer remarkably develops on both sides of the channel region 11 and grows into the channel to block the section of the path of the channel region as the reverse bias voltage is increased. The OFF-state is attained when the depletion layer blocks the section of the path of the channel region.

When this structure of the transverse JFET is employed, a JFET having stable performance can be provided by improving withstand voltage without increasing ON-state resistance and reducing the switching response time. Therefore, the JFET can be employed as a high-power high-speed switching element having low loss. This JFET, providing simple and easy fabrication steps and hardly causing trouble such as reduction of the yield, can be fabricated at a low cost as a result.

Example Corresponding to Eighth Embodiment

Figure 17:
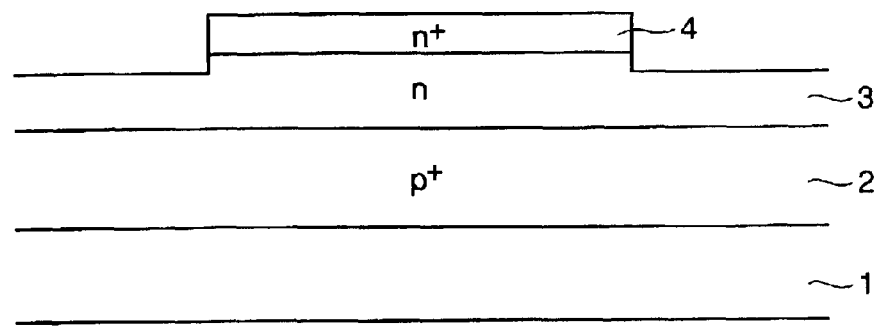
FIG. 17 is a sectional view of a stage forming an $n^+$ SiC film and patterning the same by RIE in an intermediate fabrication stage for the transverse JFET shown in FIG. 16.
Figure 18:
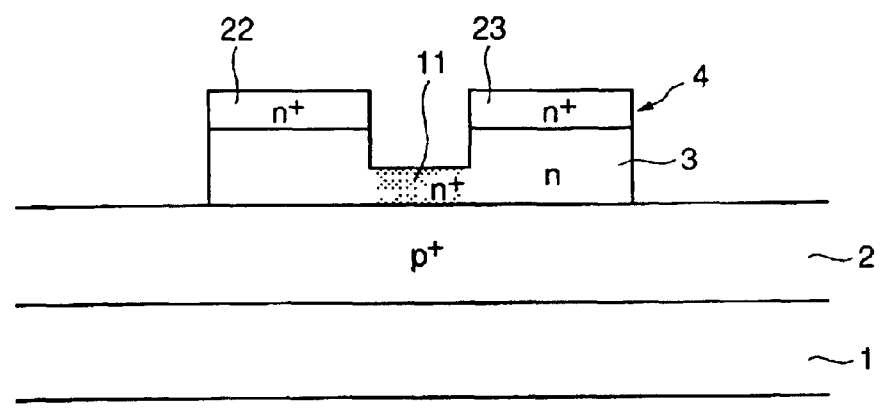
FIG. 18 is a sectional view of a stage forming a channel region by RIE and ion-implanting an impurity after the stage shown in FIG. 17.
Figure 19:
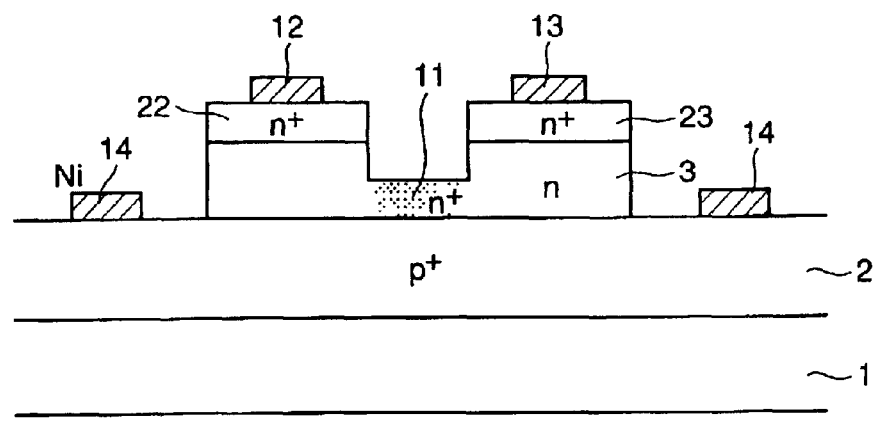
FIG. 19 is a sectional view of a stage forming an Ni film for forming electrodes after the stage shown in FIG. 18.

A transverse JFET employing the structure shown in FIG. 16 was fabricated. FIGS. 17 to 19 are diagrams illustrating steps corresponding to FIGS. 36 to 39 illustrating the method of fabricating the conventional transverse JFET. First, a p$^+$-type SiC film is formed on a p-type SiC substrate, followed by formation of an n-type SiC film. The impurity concentration of this n-type SiC film 3 was set to 1.66×10$^{17}$ cm$^{-3}$. An n$^+$-type SiC film is further formed thereon followed by etching by RIE, for patterning a region including source and drain regions (FIG. 17). Then, the center of the portion including the source and drain regions is etched by RIE for providing a trench thereby isolating the source region 22 and the drain region 23 from each other. A channel region 11 formed under the bottom of this trench is doped with an n-type impurity by ion implantation (FIG. 18). The n-type impurity concentration of the channel region 11 was set t 1.36×10$^{18}$ cm$^{-3}$. The channel length L was set to 8 μm, the channel thickness a was set to 214 nm (0.214 μm), and the width w of a direction perpendicular to the figures was set to 0.72 mm. Further, the gate electrodes are provided on the p$^+$-type SiC film 2, while the source electrode 12 and the drain electrode 13 are provided on the source region 22 and the drain region 23 which are n$^+$ impurity regions respectively (FIG. 19). Thereafter no etching step is provided for providing trenches in the p$^+$-type SiC film 2. In a comparative transverse JFET, impurity concentrations were not particularly increased in both of the source region and the drain region but left at the concentration of 1.66×10$^{17}$ cm$^{-3}$ of the n-type SiC film 3, as shown in FIG. 35. A channel was shaped identically to that of the aforementioned transverse JFET according to the present invention. Withstand voltages and ON-state resistance values were measured as to both transverse JFETs. Table 4 shows the results of measurement in both JFETs.

TABLE 4

| Channel | Withstand Voltage (V) | ON-State Resistance (With Application of 1 V) (mΩ·cm$^2$) |
|---|---|---|
| High-Impurity Concentration Channel (Inventive Example) | 155 | 0.93 |
| Conventional Channel (Comparative Example) | 155 | 2.20 |

As shown in Table 4, it was possible to reduce the ON-state resistance from 2.20 mΩ·cm$^2$ to 0.93 mΩ·cm$^2$ while keeping a high withstand voltage of 155 V.

Ninth Embodiment

Figure 20:
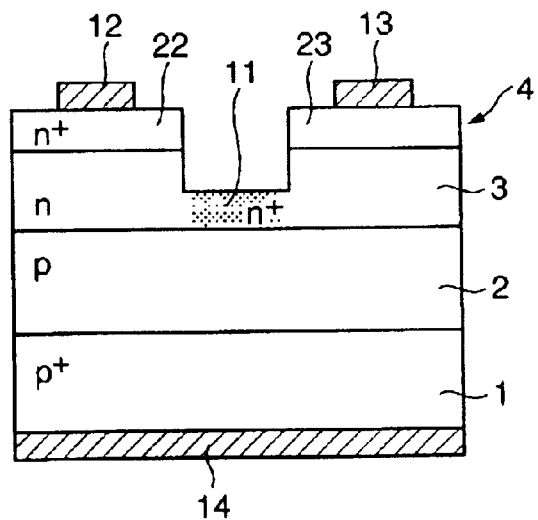
FIG. 20 is a sectional view of a transverse JFET according to a ninth embodiment of the present invention.

FIG. 20 is a sectional view of a transverse JFET according to a ninth embodiment of the present invention. The impurity concentrations of portions other than a gate electrode are identical to those in the transverse JFET shown in FIG. 16. FIG. 20 is characterized in that the gate electrode 14 is formed over the back side of a p-type SiC substrate 1.

According to the structure shown in FIG. 20, ON- and OFF-states can be implemented by the same manner of applying a gate voltage as that in FIG. 16. Further, gate resistance $R_g$ can be more reduced, whereby a rise (fall) time in switching can be reduced as a result. A fabrication method is also simplified, and improvement of the yield can be attained.

Tenth Embodiment

Figure 21:
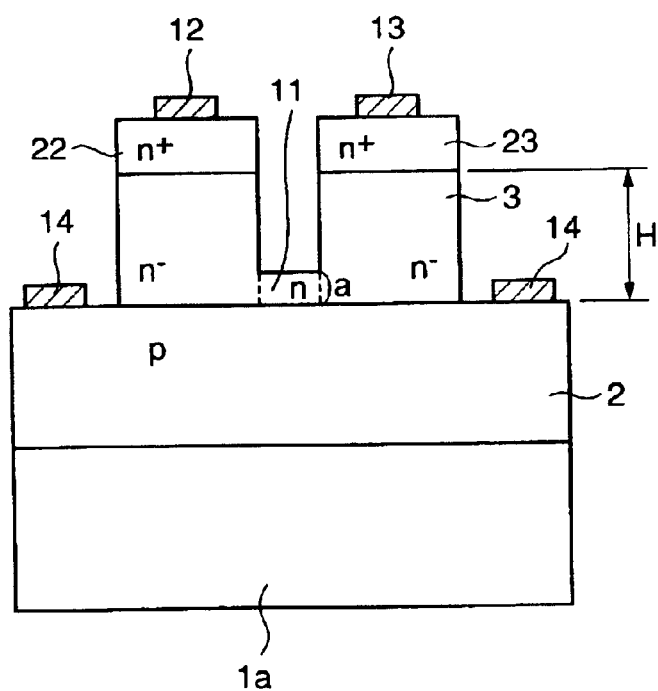
FIG. 21 is a sectional view of a transverse JFET according to a tenth embodiment of the present invention.

FIG. 21 is a sectional view of a transverse JFET according to a tenth embodiment of the present invention. Referring to FIG. 21, the thickness a of a channel region 21 is rendered smaller than the width of a depletion layer formed on the side of an n⁻ layer due to a built-in potential (about 2 V to 3 V) of a p-n⁻ junction. The "width" of the junction part indicates the thickness in FIG. 21. More specifically, the thickness a of the channel region is not more than 500 nm when the impurity concentration of the n⁻ layer is set to $1 \times 10^{16}$ cm⁻³. The impurity concentration n of the channel region is preferably set larger than the concentration n⁻ of the n⁻ layer. In order to implement an ON-state in the transverse JFET shown in FIG. 21, a positive potential higher than a source potential is applied to gate electrodes. The p-n⁻ junction is rendered conductive if the gate potential is increased beyond the built-in potential, and hence it is meaningless to increase the gate potential beyond the built-in potential. In other words, the gate potential may be set to zero in an OFF-state, while the gate potential may be set to a positive level of about 3 V in the ON-state.

Figure 22:
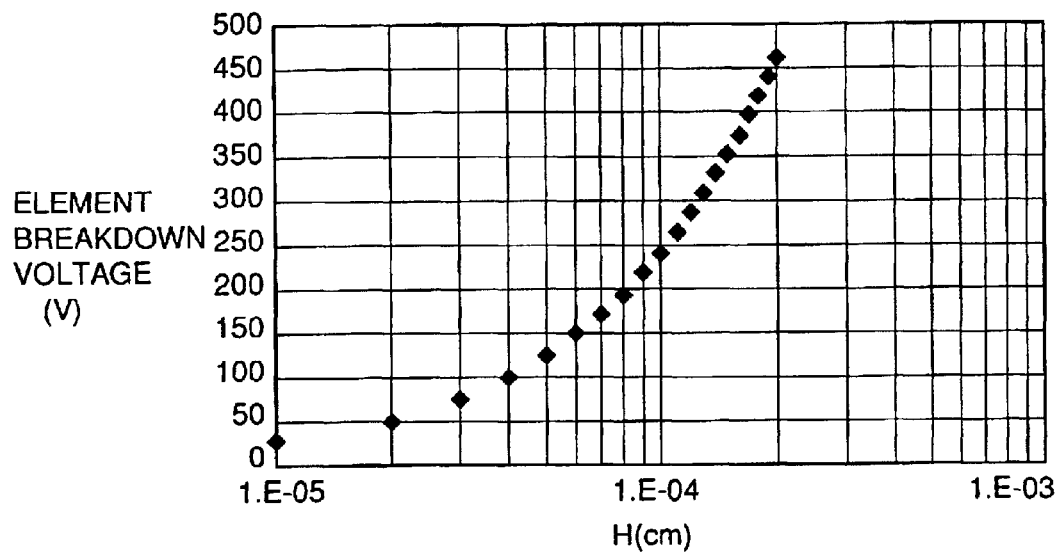
FIG. 22 illustrates the relation between an element breakdown voltage and W.

Withstand voltage design as to the transverse JFET shown in FIG. 21 is now described. The JFET is designed to have a withstand voltage of 200 V, and the thickness H of an n-type SiC film 3 shown in FIG. 21 is set to 900 nm. At this time, the withstand voltage is 210 to 220 V, reliably exceeding 200 V, on the basis of the relation between H and the withstand voltage shown in FIG. 22. When H is 900 nm, the thickness a of the channel region can be set to 500 nm, and the impurity concentration of the n⁻ layer providing the thickness of the depletion layer larger than this thickness a resulting from the built-in potential is not more than about $1 \times 10^{16}$ cm⁻³, as described above. The impurity concentration n of the channel region 11 can be set to $3.8 \times 10^{17}$ cm⁻³, which is higher than the impurity concentration of the n⁻ layer. Thus, a normally off transverse JFET can be obtained while ensuring withstand voltage. Therefore, a normally off state can be implemented, power consumption can be reduced and a rotary machine or the like can be controlled by this transverse JFET with no countermeasure against breakdown of a gate circuit.

Eleventh Embodiment

Figure 23:
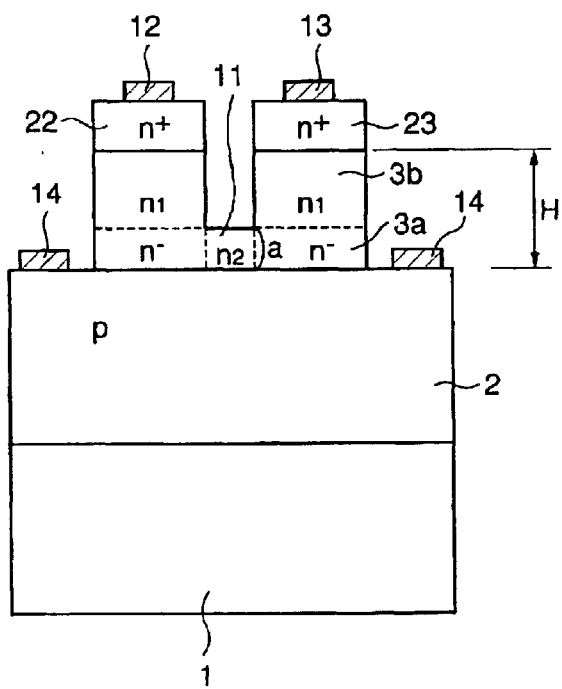
FIG. 23 is a sectional view of a transverse JFET according to an eleventh embodiment of the present invention.

FIG. 23 is a sectional view of a transverse JFET according to an eleventh embodiment of the present invention. Referring to FIG. 23, an n-type SiC film is formed by two layers of lower n⁻ layers 3a and upper $n_1$ layers 3b on both sides of a channel region 21. In order to implement withstand voltage, high-speed on-off action and a normally off state, the concentration $n_1$ of the upper layers and the concentration $n_2$ of the channel region 11 are preferably higher than n-, and $n_2$ is preferably higher than n⁻. Also according to this structure, a normally off transverse JFET can be obtained similarly to the tenth embodiment while ensuring high-speed on-off action and withstand voltage at a high level.

In order to attain a withstand voltage of 200 V, the thickness H of the aforementioned two layers (n⁻ layer/$n_1$ layer) is set to 1200 nm, while setting the impurity concentrations as follows respectively: The withstand voltage of 200 V can be ensured for obtaining a normally off transverse JFET carrying out high-speed on-off action by setting the concentration $n_1$ of the upper n layers to $1 \times 10^{17}$ cm⁻³, the concentration n⁻ of the lower n layers to $1 \times 10^{16}$ cm⁻³, the concentration $n_2$ of the channel region to $3.8 \times 10^{17}$ cm⁻³ and the thickness a of the channel region to 500 nm.

Twelfth Embodiment

Figure 24:
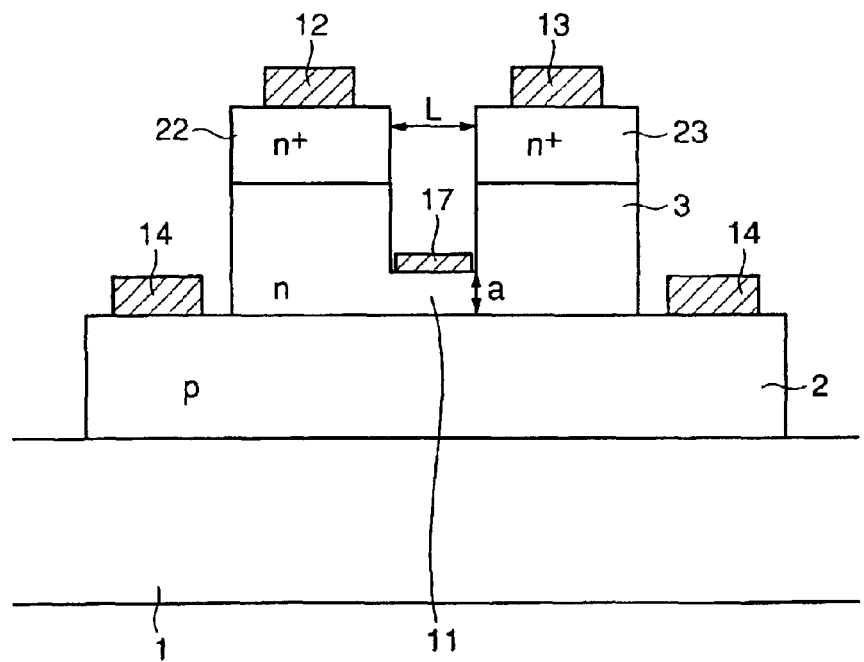
FIG. 24 is a sectional view of a transverse JFET according to a twelfth embodiment of the present invention.

FIG. 24 is a sectional view showing a transverse JFET according to a twelfth embodiment of the present invention. Referring to FIG. 24, a p-type SiC film 2 is formed on an SiC substrate 1, and an n-type SiC film 3 having a portion of a channel region 11 reduced in thickness is formed thereon. On portions of the n-type SiC film 3 located on both sides of the channel region 11, n⁺-type SiC films 22 and 23 for defining source and drain regions are formed, and source and drain electrodes 12 and 13 are further formed on the respective regions. Two gate electrodes 14 are formed on the p-type SiC film in plane on opposite outer sides of the source and drain regions. The most significant feature of this embodiment resides in that an aluminum film 17 is formed on the channel region. The sectional length of this aluminum film is smaller than a channel length L, and the aluminum film is included in the channel region in plane. In other words, the aluminum film 17 is not in contact with walls of the n-type SiC film 3 on both sides of the channel region 11.

Operation of this JFET is now described. In an ON-state, carriers flow through the channel region 11 along the substrate face. When the aluminum layer 17 is arranged on the channel region at this time, a current flows through a parallel circuit formed by the channel region 11 and the aluminum film 17. When the electric resistance of the aluminum film is lower by 1 order, for example, as compared with the electric resistance of the channel region, the current flowing through the aluminum film 17 is higher substantially by 1 order than the current flowing through the channel region. Consequently, the current flowing in the semiconductor is substantially ignorable, and transistor characteristics hardly depend on the impurity concentration of the channel region or the thickness a of the channel region. Consequently, the channel region may not be doped with an impurity of a high concentration for reducing the electric resistance thereof but other transistor characteristics can be ensured with no dispersion while keeping high withstand voltage.

Figure 25:
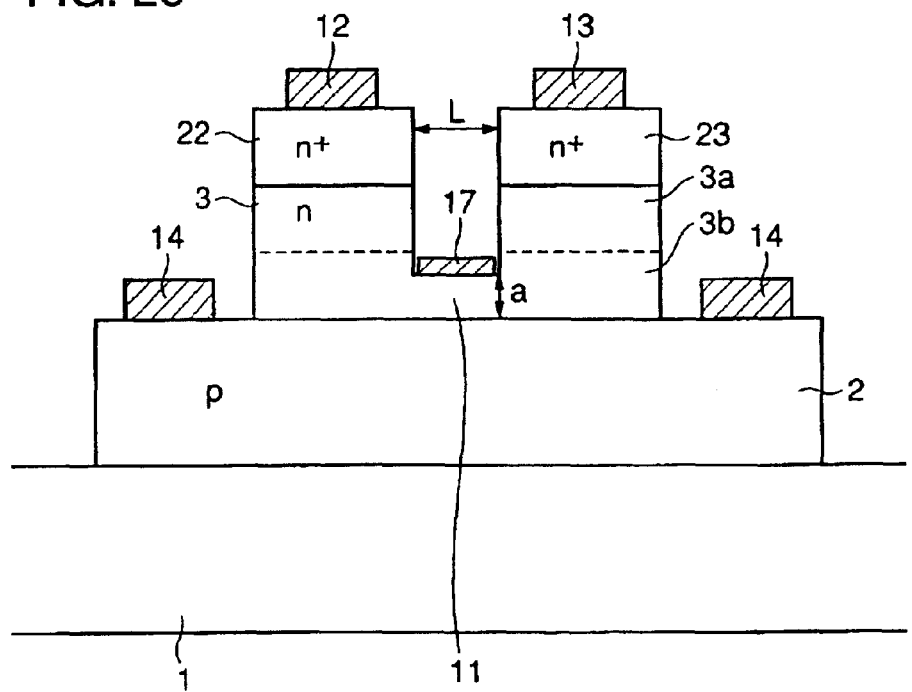
FIG. 25 is a model diagram illustrating an OFF-state in the transverse JFET shown in FIG. 24.

In an OFF-state, on the other hand, a negative potential is applied to the gate electrodes 14 shown in FIG. 25. Therefore, a depletion layer is formed on the junction between the p-type SiC film 2 and the n-type SiC film 3, and the width of the depletion layer spreads toward a side having a lower impurity concentration substantially in inverse proportion to the impurity concentration as the absolute value of the negative potential is increased. When the forward end of the width of the depletion layer exceeds the thickness a of the channel region 11, the depletion layer blocks the channel region and hinders passage of the carriers. The aluminum film 17 is not in contact with the walls on both sides of the channel region 11 as described above, and hence the OFF-state is implemented when the aforementioned forward end of the width of the depletion layer exceeds the thickness a of the channel region.

Example Corresponding to Twelfth Embodiment

The JFET shown in the twelfth embodiment of FIG. 24 was prototyped for measuring channel resistance upon application of 1 V. This JFET was prepared as an element having a withstand voltage of 100 V. The impurity concentration of the n-type SiC films 3 and 4 including the channel region was set to $4.0 \times 10^{17}$ cm⁻³, the channel length L was set to 10000 nm (10 μm), and the thickness a of the channel region was set to 230 nm.

TABLE 5

| Classification | Channel Resistance (With Application of 1 V) Unit: mΩ cm² |
|---|---|
| Inventive Example | 1.6 |
| Conventional Example | 7.8 |

According to the results shown in Table 5, the channel resistance of a conventional JFET (JFET prepared by removing the aluminum film from the JFET shown in FIG. 24) having no metal film on a channel region was 7.8 mΩcm². On the other hand, the channel resistance of the JFET (inventive sample) according to the twelfth embodiment comprising the aluminum film was remarkably reduced to 1.6 mΩcm². Therefore, it has been recognized that the channel resistance is remarkably reduced due to the inventive sample. Thus, it was possible to obtain a JFET having small dispersion between elements with no influence by fluctuation of the impurity concentration of the channel region or the thickness of the channel region.

Thirteenth Embodiment

Figure 26:
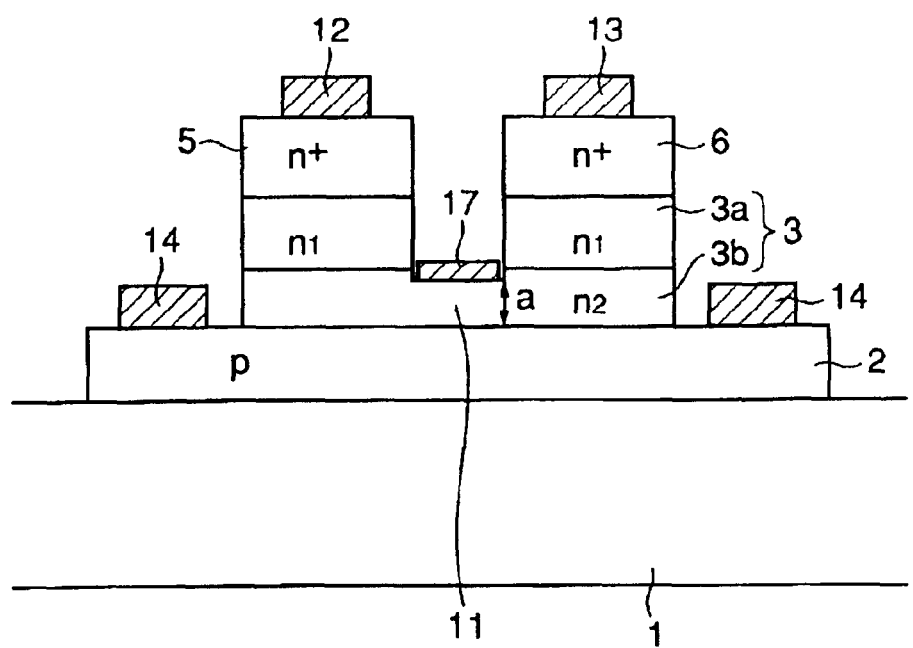
FIG. 26 is a sectional view of a transverse JFET according to a thirteenth embodiment of the present invention.

The transverse JFET according to the aforementioned twelfth embodiment shown in FIGS. 24 and 25 implements a normally on state where the current flows through the channel region 4 when the gate voltage is zero. A normally on JFET, having a possibility of not stopping rotation when employed for controlling a rotary machine or the like and a gate circuit is broken down, must comprise a mechanism for dealing with breakdown of the gate circuit. It is troublesome to comprise such a mechanism, and hence a normally off JFET is desirable. The normally off JFET is described with reference to a second embodiment. As shown in FIG. 26, the maximum feature of this embodiment resides in the following point: The width of a depletion layer resulting from a built-in potential of a p-$n_2$ junction, i.e., a depletion layer formed when a gate potential is zero, is rendered larger than the thickness a of a channel region. When (a) setting a concentration $n_2$ to $1 \times 10^{16}$ cm$^{-3}$ and (b) setting the thickness a of the channel region to not more than about 500 nm, for example, the width of the depletion layer resulting from the built-in potential exceeds the thickness a of the channel region, so that the normally off JFET can be obtained.

When employing the aforementioned structure, a normally off JFET neither reducing withstand voltage nor dispersing characteristics due to fluctuation of the channel concentration or the like can be implemented. Consequently, the JFET can be applied to a controller for a large-sized rotary machine or the like without providing a mechanism for dealing with breakdown of a gate circuit.

Fourteenth Embodiment

Figure 27:
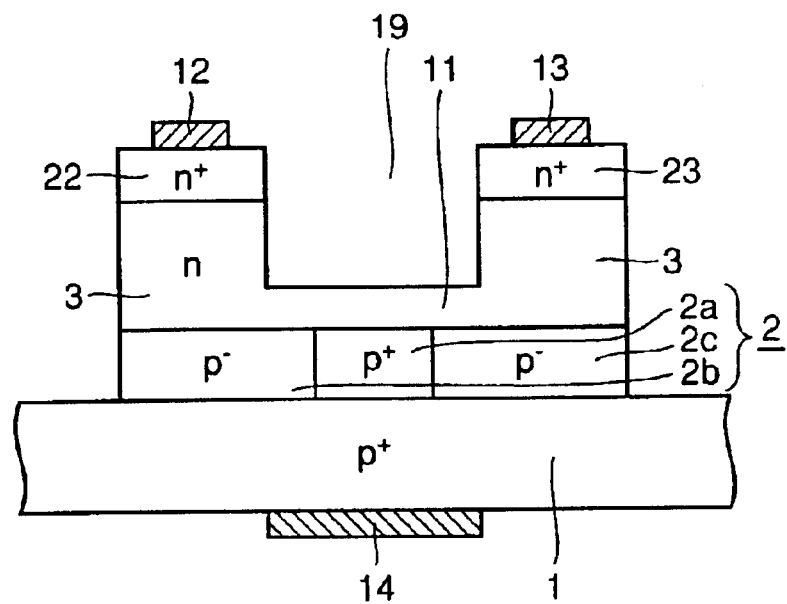
FIG. 27 is a sectional view of a transverse JFET according to a fourteenth embodiment of the present invention.

FIG. 27 is a sectional view showing a transverse JFET according to a fourteenth embodiment of the present invention. On a p$^+$-type SiC substrate, p-type epitaxial SiC films 2a, 2b and 2c adjusted in concentration in response to regions are formed. A p$^+$ SiC layer 2a is formed on a high-concentration impurity region located under a channel region 11, and p$^-$ SiC layers 2b and 2c of high electric resistance layers are arranged on both sides thereof. An n-type epitaxial SiC film is formed thereon, and a trench 19 defines portions connecting the channel region 11 and source and drain regions 22 and 23. High-concentration n$^-$ source and drain regions 22 and 23 are formed on these portions for implementing ohmic contact respectively, and source and drain electrodes 12 and 13 are provided thereon. A gate electrode 14 is provided on the back side of the high-concentration p$^+$-type SiC substrate, for forming a back gate structure. The gate electrode is provided on the SiC substrate containing an impurity in high concentration, since ohmic contact can be obtained. However, the gate electrode may not necessarily have the back gate structure, but such gate electrodes may alternatively be provided on portions of the Sic substrate 1 located on sides of the p$^-$ SiC layers 2b and 2c of high electric resistance layers. When the back gate structure is employed, a power device improved in degree of integration can be formed. When the gate electrodes are provided on the portions of the SiC substrate 1 located on sides of the p$^-$ SiC layers 2b and 2c of high electric resistance layers, on the other hand, the JFET can be advantageously completed while forming respective portions on a single face in a fabrication flow for a semiconductor device such as an LSI chip.

FIG. 27 is characterized in that the length of the p$^+$ SiC layer 2a is rendered smaller than the length of the channel region, and although the impurity concentration is high, electric resistance of this high-concentration impurity region is increased by reducing the sectional area in the thickness direction. Referring to FIG. 27, it is assumed that the direction perpendicular to the plane of the figure is the width direction of the transverse JFET, the longitudinal direction of the channel is the length, and the direction orthogonal to the plane of lamination is the thickness direction.

The aforementioned p$^+$ SiC layer 2a of the high-concentration impurity region may not be provided under the channel region 11 but may be located on a portion close to the source region 22. The p$^-$ SiC layers 2b and 2c of the high-resistance regions located on both sides thereof have a low impurity concentration and high resistance, and hence the quantities of currents leaking from the source and channel regions and penetrating into the p$^-$ SiC layers 2b and 2c are reduced.

When the p$^+$ SiC layer 2a is formed by ion implantation, the minimum width can be set to about 1 μm. Therefore, the resistance of this p$^+$ SiC layer 2a reaches a large value.

When providing the p$^+$ SiC layer 2a small and reducing the concentration on both sides thereof as described above, a channel leakage current following a forward bias can be suppressed as compared with the prior art. Consequently, reduction of the amplification factor in an ON-state can be prevented.

Fifteenth Embodiment

Figure 28:
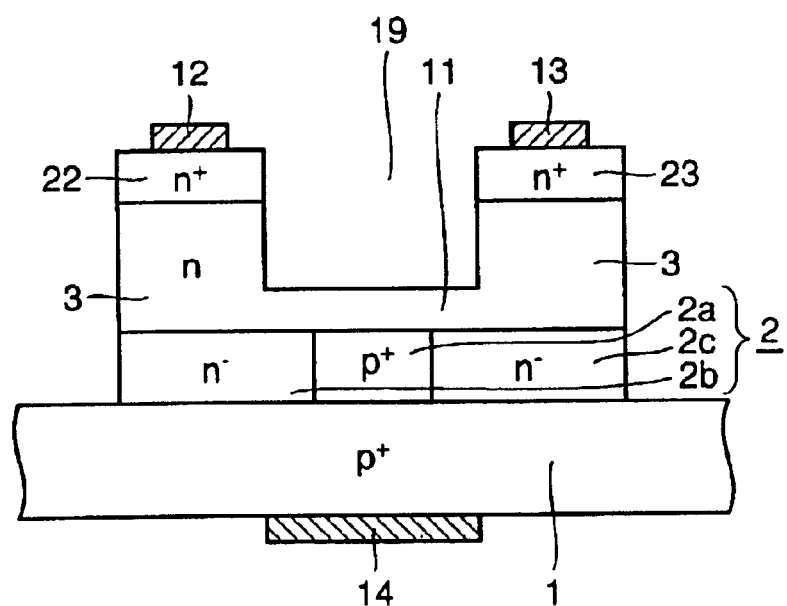
FIG. 28 is a sectional view of a transverse JFET according to a fifteenth embodiment of the present invention.

FIG. 28 is a sectional view showing a transverse JFET according to a fifteenth embodiment of the present invention. Structures different from those of the transverse JFET shown in FIG. 27 are only high-resistance regions under source, channel and drain regions. These high-resistance regions are provided as n$^-$ SiC layers 2b and 2c on both sides of a p$^+$ SiC layer 2a. The n-type impurity concentration of these layers 2b and 2c is reduced, as a matter of course.

In the case of the aforementioned structure, the resistance of the n$^-$ SiC layers 2b and 2c on both sides of the p$^+$ SiC layer 2a is large similarly to the fourteenth embodiment. Therefore, currents leaking from the source and channel regions to a first SiC film are suppressed and reduction of the amplification factor can be prevented, similarly to the fourteenth embodiment.

Sixteenth Embodiment

Figure 29:
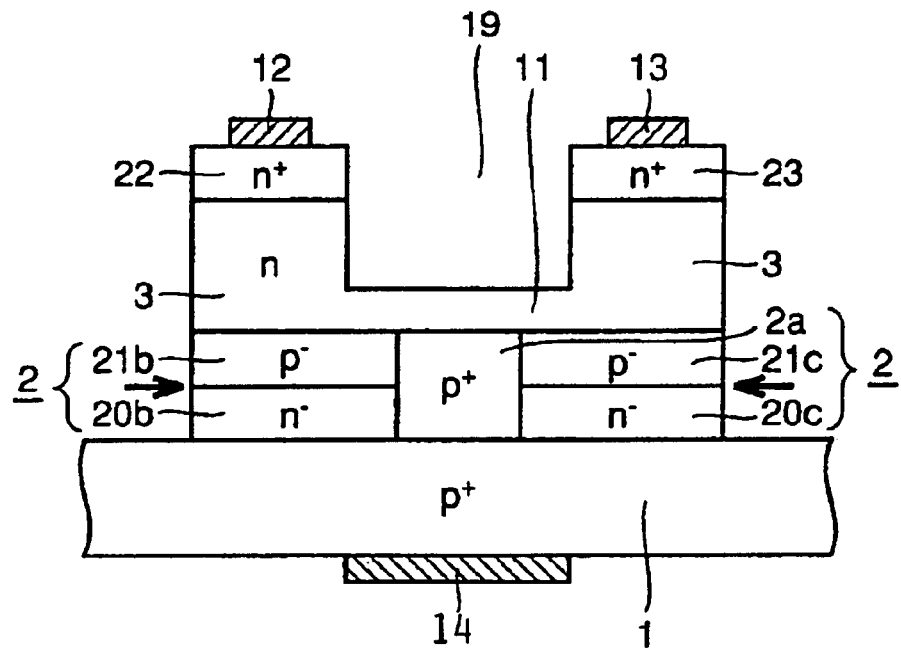
FIG. 29 is a sectional view of a transverse JFET according to a sixteenth embodiment of the present invention.

FIG. 29 is a sectional view showing a transverse JFET according to a sixteenth embodiment of the present invention. Structures different from those of the transverse JFET shown in FIG. 27 are only high-resistance regions under source, channel and drain regions. These high-resistance regions are provided as two-stage layers, i.e., p⁻ SiC layers 21b and 21c/n⁻ SiC layers 20b and 20c on both sides of a p⁺ SiC layer 2a. A reverse bias voltage is applied to p⁻-n⁻ junction planes of the high-resistance regions provided on both sides in an ON-state. Therefore, depletion layers are formed on the p⁻-n⁻ junction planes shown by arrows in FIG. 29. Thus, resistance against currents leaking from source and channel regions is extremely increased, and the aforementioned leakage currents are remarkably suppressed. The case where depletion layers are formed on peripheral regions other than a high-concentration impurity region of a first SiC film so that the electric resistance of high-resistance regions is extremely increased in an ON-state as in this embodiment is most desirable.

Seventeenth Embodiment

Figure 30:
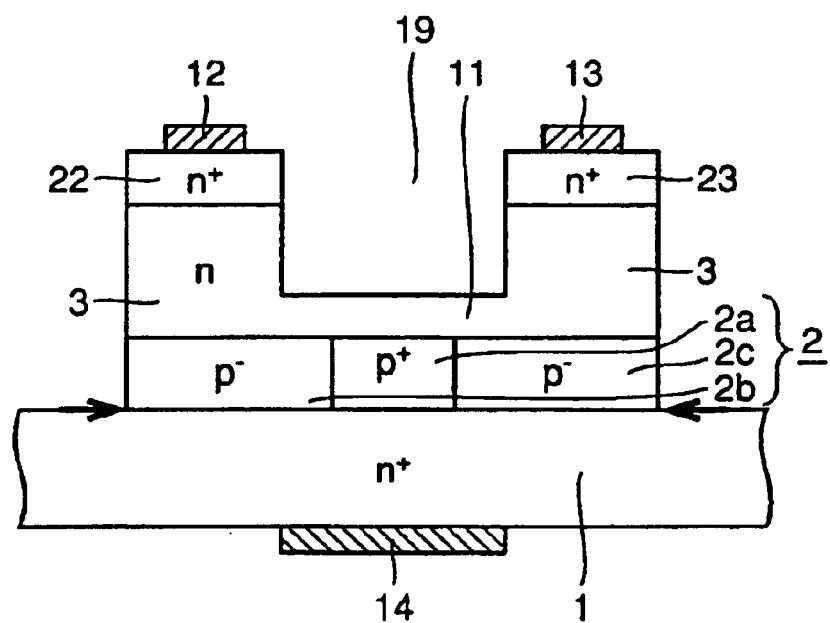
FIG. 30 is a sectional view of a transverse JFET according to a seventeenth embodiment of the present invention.

FIG. 30 is a sectional view showing a transverse JFET according to a seventeenth embodiment of the present invention. The structure of the transverse JFET shown in FIG. 30 is different from that of the transverse JFET according to the fourteenth embodiment shown in FIG. 27 only in a point that an n⁺ SiC substrate 1 is employed as the substrate. In other words, a p⁺ SiC layer 2a of a high-concentration impurity region is provided with the smallest possible length, similarly to the fourteenth embodiment.

The n⁺ SiC substrate 1 is employed as the substrate, whereby a reverse bias voltage is applied to junction planes between the substrate 1 and p⁻ SiC layers 2b and 2c in an ON-state, and hence depletion layers grow on the p⁻ SiC layers 2b and 2c. According to this embodiment, therefore, resistance is extremely increased due to formation of the depletion layers on both sides of the p⁺ SiC layer 2a of the high-concentration impurity region, so that currents leaking from source and channel regions to a first SiC film can be remarkably suppressed. Also in the seventeenth embodiment, a case where depletion layers are formed on high-resistance layers in an ON-state is most desirable.

Eighteenth Embodiment

Figure 31:
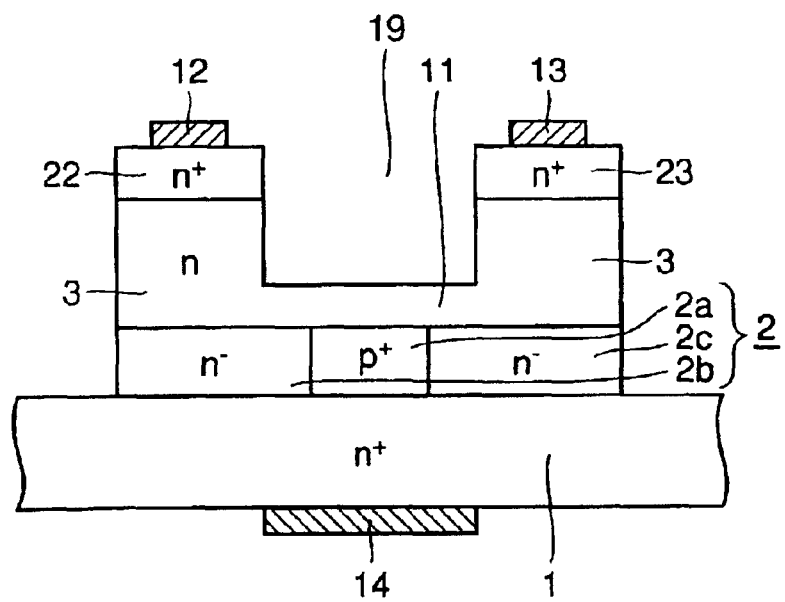
FIG. 31 is a sectional view of a transverse JFET according to an eighteenth embodiment of the present invention.

FIG. 31 is a sectional view showing a transverse JFET according to an eighteenth embodiment of the present invention. The structure of the transverse JFET shown in FIG. 31 is different from that of the transverse JFET according to the fifteenth embodiment shown in FIG. 28 only in a point that an n⁺ SiC substrate 1 is employed as the substrate. In other words, a p⁺ SiC layer 2a of a high-concentration impurity region is provided with the smallest possible length, similarly to the fifteenth embodiment. A principle suppressing currents leaking to a first SiC film is also identical to that in the transverse JFET shown in FIG. 28, and hence description is omitted.

Nineteenth Embodiment

Figure 32:
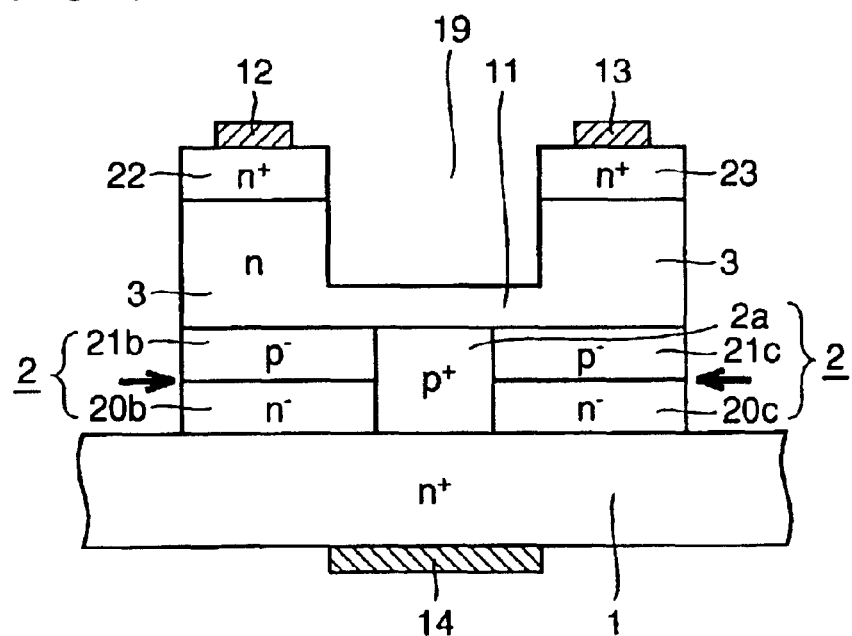
FIG. 32 is a sectional view of a transverse JFET according to a nineteenth embodiment of the present invention.

FIG. 32 is a sectional view showing a transverse JFET according to a nineteenth embodiment of the present invention. The structure of the transverse JFET shown in FIG. 32 is different from that of the transverse JFET according to the sixteenth embodiment shown in FIG. 29 only in a point that an n⁺ SiC substrate 1 is employed as the substrate. In other words, a p⁺ SiC layer 2a of a high-concentration impurity region is provided with the smallest possible length, similarly to the sixteenth embodiment. A principle suppressing currents leaking to a first SiC film as well as a principle forming depletion layers are also identical to those in the transverse JFET shown in FIG. 29, and hence description is omitted.

Twentieth Embodiment

Figure 33:
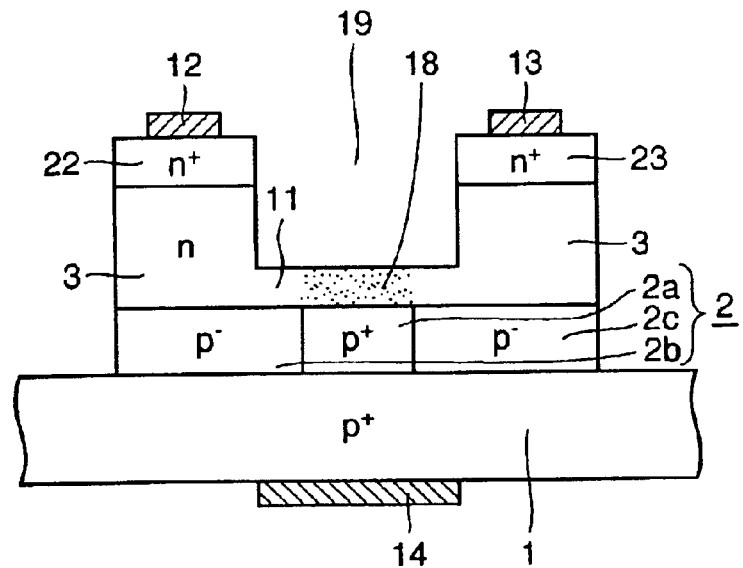
FIG. 33 is a sectional view of a transverse JFET according to a twentieth embodiment of the present invention.
Figure 34:
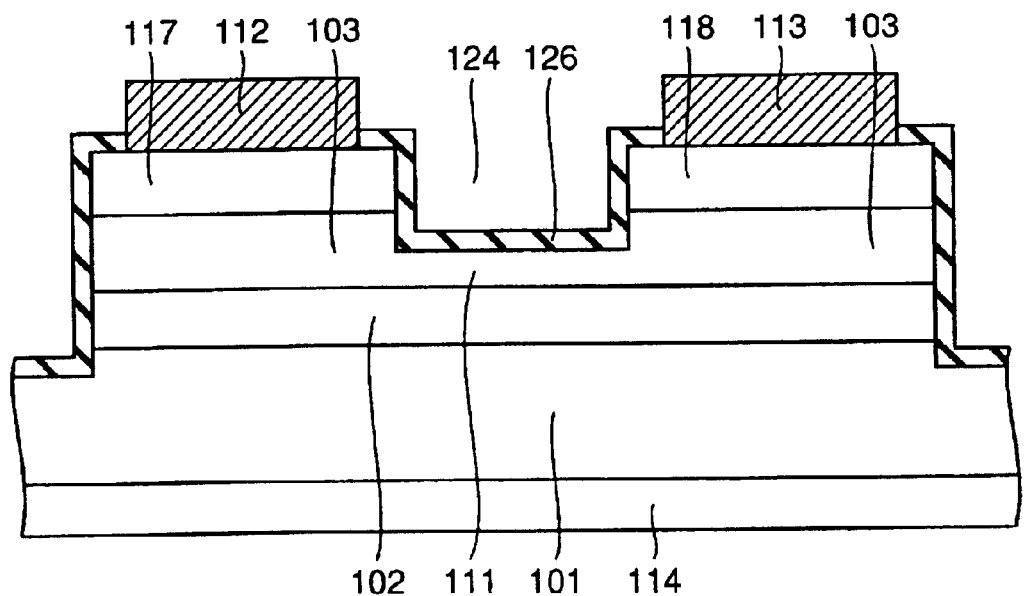
FIG. 34 is a sectional view of a conventional transverse JFET.

FIG. 33 is a sectional view showing a transverse JFET according to a twentieth embodiment of the present invention. Each of the aforementioned fourteenth to nineteenth embodiments has been assumed to carry out normally on operation. In other words, it has been assumed that a gate voltage is set to zero or slightly plus with respect to a source potential (ground potential in general) for attaining an ON-state. In order to attain an OFF-state, therefore, a prescribed minus voltage must be applied to a gate. However, an additional control circuit must be provided on a normally on JFET as a countermeasure against breakdown, and a transverse JFET carrying out normally off operation is more preferable. In other words, it is preferable that a depletion layer grows to a channel region from a p⁺ SiC layer 2a to block the channel region when the gate voltage is zero, for attaining an ON-state when the gate voltage is set to a prescribed plus level.

Referring to FIG. 33, the concentration of a p⁺SiC layer 2 of a high-concentration impurity region is increased and the n-type impurity concentration of a channel region 11 is reduced so that a depletion layer 18 blocks the channel region 11 with a gate voltage of zero, i.e., with a built-in potential. Therefore, the JFET is turned off with the gate voltage of zero, and no control circuit may be provided for dealing with breakdown of a gate circuit. The structure of the transverse JFET shown in FIG. 33 is identical to the structure of the transverse JFET shown in FIG. 27 except the aforementioned portion, and hence a mechanism of suppressing currents leaking from source and channel regions to a first SiC film is identical to that described in the fourteenth embodiment.

While embodiments and Examples of the present invention have been described in the above, the embodiments and Examples of the present invention disclosed in the above are only illustrative, and the scope of the present invention is not restricted to these embodiments and Examples of the present invention. The scope of the present invention is shown by description of the scope of claim for patent, and includes all modifications within the meaning and range equivalent to the description of the scope of claim for patent.

According to the present invention, it is possible to obtain a JFET of SiC employing an n-type SiC substrate bringing a high yield and comprising a channel region employing electrons having high mobility. Further, it is possible to provide a transverse JFET of uniform quality suitable for a high-power semiconductor switching element excellent in withstand voltage and high-speed property. Further it is possible to obtain a transverse JFET capable of suppressing currents leaking from source and channel regions to a first SiC film and preventing reduction of the amplification factor.

What is claimed is:

1. A transverse junction field effect transistor comprising:
an SiC substrate;
a second conductivity type first SiC film (2) formed on a front face of said SiC substrate;
a first conductivity type second SiC film (3) formed on said second conductivity type first SiC film;
a channel region formed in said first conductivity type second SiC film;
a source region and a drain region, respectively comprising films consisting of first conductivity type SiC formed on said first conductivity type second SiC film respectively separately on opposite sides of said channel region; and a gate electrode arranged in contact with said SiC substrate in one of the following arrangements: on a back side of said SiC substrate, or on and surrounded by a flat region of said front face of said SiC substrate with said flat region extending laterally beyond said gate electrode, or on and surrounded by a flat region of said second conductivity type first SiC film with said flat region extending laterally beyond said gate electrode;

wherein said second conductivity type first SiC film (2) consists of:
- a high-concentration impurity region (2a), located under said channel region (11), having a width substantially identical to a width of said channel region and a length smaller than a length of said channel region, and containing a second conductivity type impurity in a higher concentration than a first conductivity impurity concentration of said channel region; and
- a high-resistance region (2b, 2c, 20b, 20c, 21b, 21c), other than said high-concentration impurity region, having high electric resistance.

2. The transverse junction field effect transistor according to claim 1, wherein said high-resistance region (2b, 2c, 20b, 20c, 21b, 21c) contains a first conductivity type impurity having a concentration lower than a first conductivity type impurity concentration of said second SiC film (3).

3. The transverse junction field effect transistor according to claim 1, wherein said high-resistance region (2b, 2c, 20b, 20c, 21b, 21c) contains a second conductivity type impurity having a concentration lower than a first conductivity type impurity concentration of said second SiC film (3).

4. The transverse junction field effect transistor according to claim 1, wherein said high-resistance region (20b, 20c, 21b, 21c) consists of a two-layer structure of a first layer and a second layer, wherein said first layer contains a first conductivity type impurity having a concentration lower than a first conductivity type impurity concentration of said second SiC film, and said second layer contains a second conductivity type impurity having a concentration lower than the first conductivity type impurity concentration of said second SiC film.

5. The transverse junction field effect transistor according to claim 1, wherein said high-concentration impurity region and said channel region are so formed that a depletion layer resulting from a built-in potential shuts off said channel region.

6. The transverse junction field effect transistor according to claim 1, wherein said channel region (11) contains a first conductivity type impurity of a higher concentration than an impurity concentration of portions of said first conductivity type second SiC film located on both sides thereof.

7. The transverse junction field effect transistor according to claim 1, further comprising a conductor film (17) arranged in contact with a surface of said channel region (11).

8. The transverse junction field effect transistor according to claim 7, wherein said conductor film (17) has a length along a direction of said length of said channel region that is smaller than said length (L) of said channel region.

9. The transverse junction field effect transistor according to claim 7, wherein said channel region (11) has a thickness (a) that is smaller than a width of a depletion layer in said first conductivity type second SiC film (3) resulting from a built-in potential on a junction between said second conductivity type first SiC film (2) and said first conductivity type second SiC film (3) formed on said second conductivity type first SiC film (2).

10. The transverse junction field effect transistor according to claim 9, wherein said conductor film (17) is either a metal film or a semiconductor film containing a high-concentration impurity.

11. The transverse junction field effect transistor according to claim 1, wherein said gate electrode is arranged on said back side of said SiC substrate.

12. The transverse junction field effect transistor according to claim 1, wherein said high electric resistance of said high-resistance region is higher than an electric resistance of said high-concentration impurity region.

* * * * *